(12) United States Patent
Ishikawa et al.

(10) Patent No.: US 12,191,292 B2
(45) Date of Patent: Jan. 7, 2025

(54) COMPOSITE INTEGRATED FILM, COMPOSITE INTEGRATED FILM SUPPLY WAFER, AND SEMICONDUCTOR COMPOSITE DEVICE

(71) Applicant: Oki Electric Industry Co., Ltd., Tokyo (JP)

(72) Inventors: Takuma Ishikawa, Tokyo (JP); Takahito Suzuki, Tokyo (JP); Kenichi Tanigawa, Tokyo (JP); Hironori Furuta, Tokyo (JP); Toru Kosaka, Tokyo (JP); Yusuke Nakai, Tokyo (JP); Shinya Jyumonji, Tokyo (JP); Genichiro Matsuo, Tokyo (JP); Chihiro Takahashi, Tokyo (JP); Hiroto Kawada, Tokyo (JP); Yuuki Shinohara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 584 days.

(21) Appl. No.: 17/504,306

(22) Filed: Oct. 18, 2021

(65) Prior Publication Data

US 2022/0157796 A1 May 19, 2022

(30) Foreign Application Priority Data

Nov. 16, 2020 (JP) ................................ 2020-190406

(51) Int. Cl.
*H01L 25/16* (2023.01)
*H01L 33/62* (2010.01)

(52) U.S. Cl.
CPC ............ *H01L 25/167* (2013.01); *H01L 33/62* (2013.01)

(58) Field of Classification Search
CPC . H01L 25/167; H01L 33/62; H01L 21/02565; H10B 61/22; H10N 50/01
See application file for complete search history.

(56) References Cited

U.S. PATENT DOCUMENTS

2006/0043552 A1* 3/2006 Suga ...................... H01L 24/13
257/E21.511
2009/0075415 A1* 3/2009 Nakamura .......... B81C 1/00333
438/51

(Continued)

FOREIGN PATENT DOCUMENTS

JP 2005093649 A 4/2005
JP 2010056488 A 3/2010

(Continued)

*Primary Examiner* — Evren Seven
*Assistant Examiner* — Cole Leon Lindsey
(74) *Attorney, Agent, or Firm* — Rabin & Berdo, P.C.

(57) ABSTRACT

A composite integrated film includes a base member thin film having a base member first surface and a base member second surface facing each other, one or more penetration parts penetrating the base member first surface and the base member second surface of the base member thin film, one or more electrodes each including an electrical path part formed between the base member first surface and the base member second surface via the penetration part and an electrode surface in a planar shape formed on the base member second surface's side, and one or more elements provided on the base member first surface of the base member thin film and electrically connected to the electrodes, wherein the electrode surface and the base member second surface form a same flat surface.

19 Claims, 14 Drawing Sheets

(56) References Cited

U.S. PATENT DOCUMENTS

| | | | |
|---|---|---|---|
| 2010/0214200 A1* | 8/2010 | Suzuki | H01L 33/62 |
| | | | 345/82 |
| 2016/0190103 A1 | 6/2016 | Kabe et al. | |
| 2017/0092626 A1 | 3/2017 | Yuan et al. | |
| 2017/0186740 A1 | 6/2017 | Cok et al. | |
| 2018/0174932 A1 | 6/2018 | Cok et al. | |
| 2019/0139949 A1 | 5/2019 | Liu et al. | |
| 2019/0378770 A1 | 12/2019 | Iguchi | |
| 2020/0220056 A1 | 7/2020 | Otto et al. | |

FOREIGN PATENT DOCUMENTS

| | | |
|---|---|---|
| JP | 2011126262 A | 6/2011 |
| JP | 2018506850 A | 3/2018 |
| WO | 2017043216 A1 | 3/2017 |

\* cited by examiner

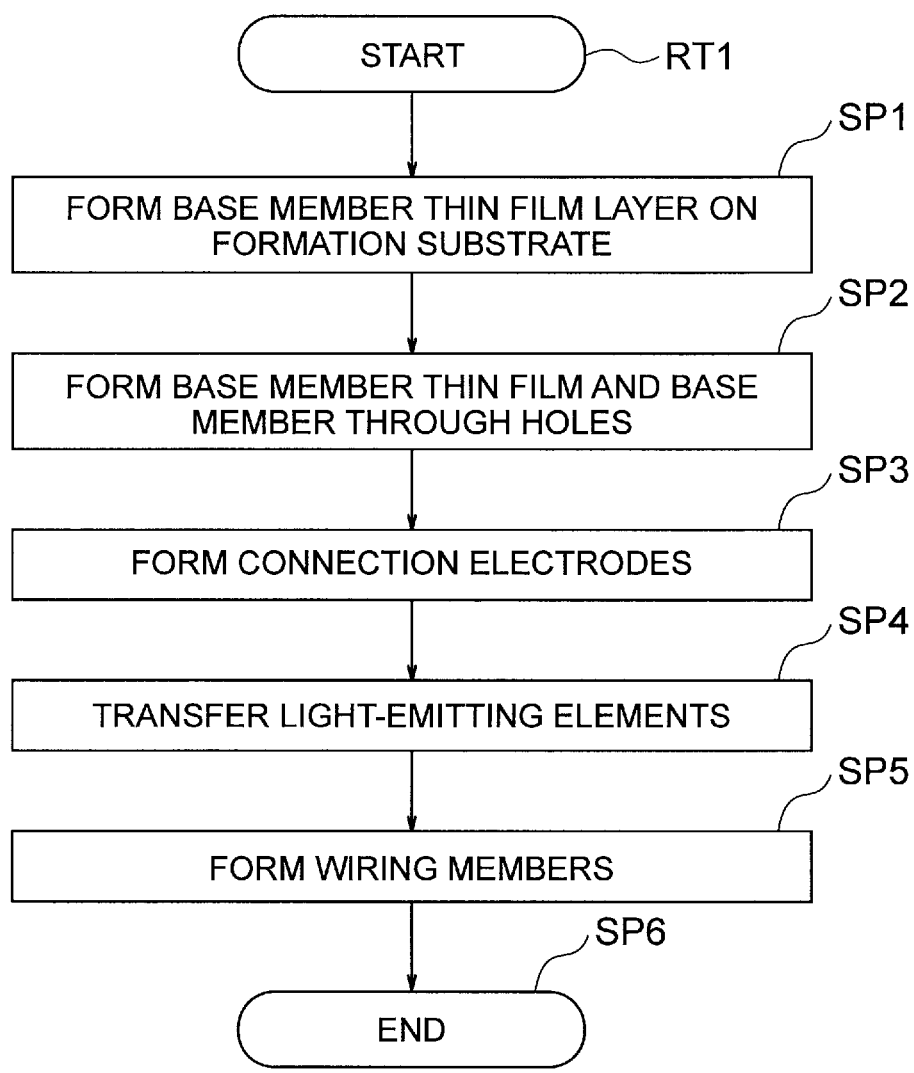

COMPOSITE INTEGRATED FILM, COMPOSITE INTEGRATED FILM SUPPLY WAFER, AND SEMICONDUCTOR COMPOSITE DEVICE

BACKGROUND OF THE INVENTION

1. Field of the Invention

The disclosure relates to a composite integrated film, a composite integrated film supply wafer and a semiconductor composite device that are suitable for application to a display device of a micro-LED (Light-Emitting Diode) type formed by arranging a plurality of small-sized LEDs, for example.

2. Description of the Related Art

In recent years, display devices using a liquid crystal panel are widespread as display devices, and display devices using a display of a new type such as an organic EL (Electro-Luminescence) type or the micro-LED type are being developed for the purpose of improving image quality or the like.

In a display of the micro-LED type (hereinafter referred to as a "micro-LED display"), one pixel (referred to also as a picture element or a dot) is formed by LEDs of three colors such as R (Red), G (Green) and B (Blue), and a great number of LED elements are arranged like a grid on a circuit board. The micro-LED display is capable of displaying high-quality images by finely controlling the light emission level of each LED element individually.

In general, flip-chip bonding is performed in cases of mounting electronic components such as minute LED elements on a circuit board. In the flip-chip bonding, electrodes of the electronic components and electrodes on the circuit board are connected to each other by eutectic bonding to form alloy, by which the electronic components are physically fixed to the circuit board and electrically connected to the circuit board.

Incidentally, in regard to the micro-LED displays, reduction in the defective rate in the manufacturing process, namely, improvement of the so-called manufacturing yield, is one major challenge. Especially in cases of the flip-chip bonding, when an electronic component mounted on the circuit board is judged to be defective, removing the electronic component from the circuit board damages electrodes to no small extent, and thus it is difficult to stably mount a new electronic component on the same position.

In such a circumstance, mainly for the micro-LED displays, there have been proposed various techniques that seem to lead to the improvement of the manufacturing yield through elimination of defects. For example, US 2018/0174932 A1 (Patent Reference 1) proposes a technique in which redundant LED elements are previously mounted on the circuit board and wiring is selectively carried out depending on the result of a test. Further, US 2017/0186740 A1 (Patent Reference 2) proposes a technique in which a redundant space in which an LED element can be mounted is previously provided in a pixel on the circuit board and a new LED element is mounted in the vicinity of the part judged to be defective.

However, even though the above-described techniques lead to the improvement of the manufacturing yield, spaces for mounting redundant LED elements become necessary on the circuit board, and thus there is a problem in that it is impossible to increase the degree of integration of the display pixels (the so-called pixels), i.e., packaging density or pixel density, and it is difficult to realize a higher resolution of the display.

SUMMARY OF THE INVENTION

An object of the disclosure is to provide a composite integrated film, a composite integrated film supply wafer and a semiconductor composite device with which defects can be eliminated with ease and the packaging density can be increased.

A composite integrated film of the disclosure includes a base member thin film having a base member first surface and a base member second surface facing each other; one or more penetration parts penetrating the base member first surface and the base member second surface of the base member thin film; one or more electrodes each including an electrical path part formed between the base member first surface and the base member second surface via the penetration part and an electrode surface in a planar shape formed on the base member second surface's side; and one or more elements provided on the base member first surface of the base member thin film and electrically connected to the electrodes, wherein the electrode surface and the base member second surface form a same flat surface.

A composite integrated film supply wafer of the disclosure includes a wafer; and a plurality of the above-mentioned composite integrated films, wherein at least either of the base member second surface and the electrode surface on each of the plurality of composite integrated films and a front surface of the wafer are in contact with each other.

A semiconductor composite device of the disclosure includes a circuit board; and a plurality of the above-mentioned composite integrated films, wherein the circuit board includes: a drive circuit that selectively drives a plurality of the elements; a plurality of first direction wires; a plurality of second direction wires; and a plurality of connection pads each being electrically connected to the first direction wire or the second direction wire, the electrode surfaces of the composite integrated films are joined to the connection pads of the circuit board by intermolecular forces, and at least a part of the base member second surface of the composite integrated film is joined to a front surface of the circuit board by intermolecular forces.

A semiconductor composite device of another example of the disclosure includes a circuit board; and a plurality of the above-mentioned composite integrated films, wherein the circuit board includes: a drive circuit that selectively drives a plurality of the elements; a plurality of first direction wires; a plurality of second direction wires; and a plurality of connection pads each being electrically connected to the first direction wire or the second direction wire, the electrode surfaces of the composite integrated films are joined to the connection pads of the circuit board by eutectic joining, and at least a part of the base member second surface of the composite integrated film is joined to a front surface of the circuit board by intermolecular forces.

BRIEF DESCRIPTION OF THE DRAWINGS

In the drawings,

FIG. 2 is a flowchart showing a manufacturing procedure of the composite integrated film according to the first embodiment;

DETAILED DESCRIPTION OF THE INVENTION

Figure 1A:
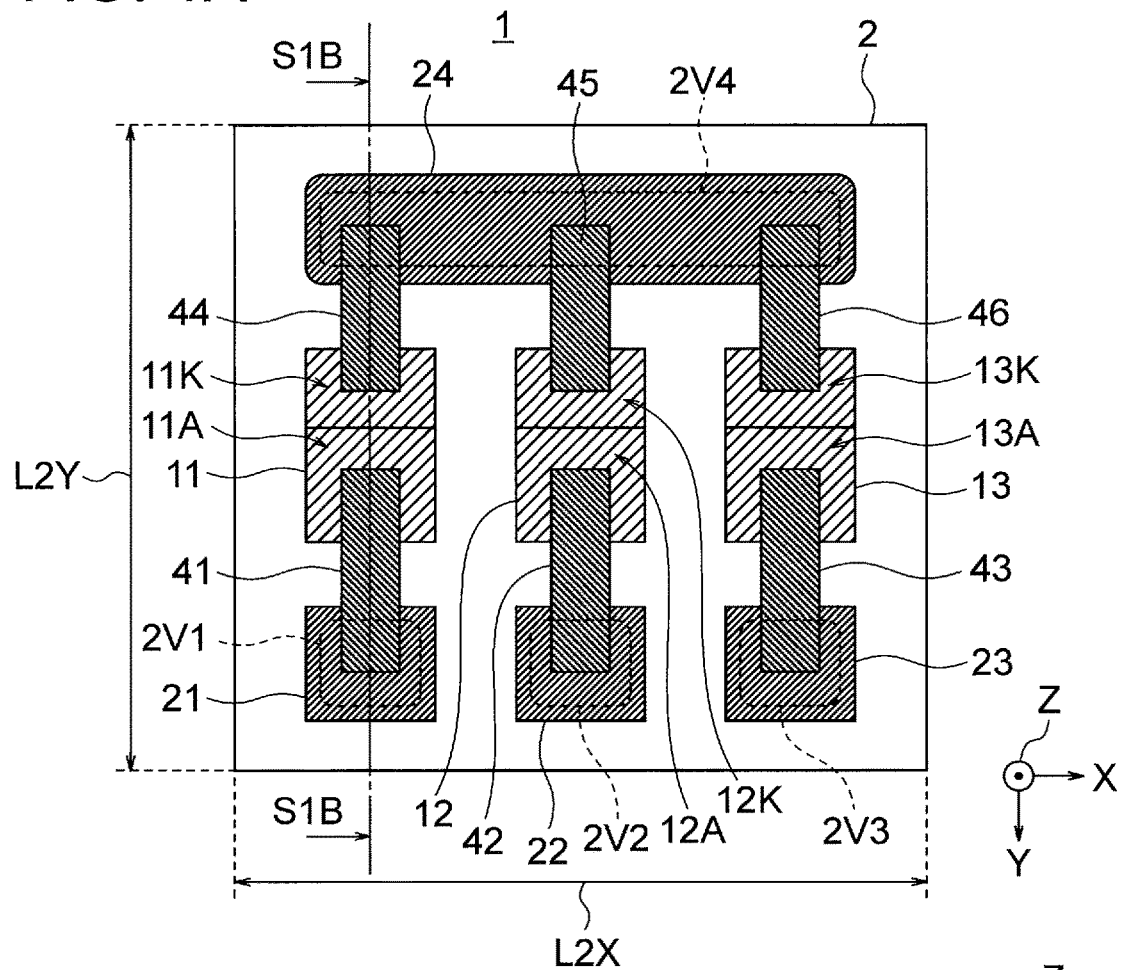
FIGS. 1A to 1C are a schematic plan view, a schematic cross-sectional view and a principal part enlarged view showing the configuration of a composite integrated film according to a first embodiment.

Modes for carrying out the invention (hereinafter referred to as "embodiments") will be described below by using the drawings. Incidentally, throughout the drawings, components identical or similar to each other are assigned the same reference character.

1. First Embodiment

[1-1. Configuration of Composite Integrated Film]

Figure 1B:
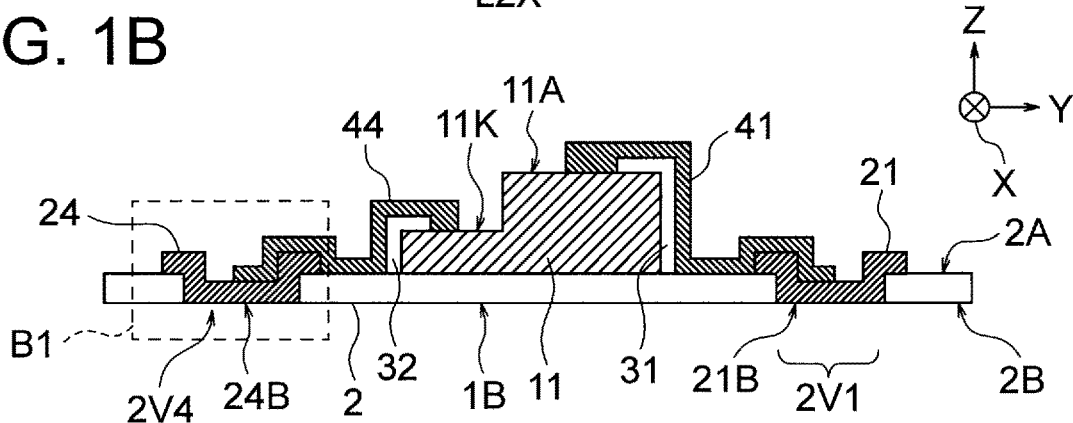
Figure 1C:
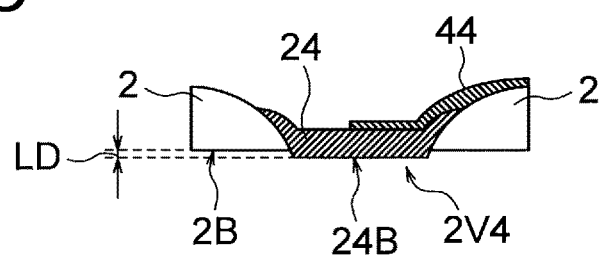

FIGS. 1A to 1C are a schematic plan view, a schematic cross-sectional view and a principal part enlarged view showing the configuration of a composite integrated film 1 according to a first embodiment. FIG. 1B shows a cross section of the composite integrated film 1 of FIG. 1A sliced along the line S1B-S1B. FIG. 1C magnifies a principal part B1 in FIG. 1B. The composite integrated film 1 according to the first embodiment includes one or more components provided on one side of a base member thin film 2. For convenience of the explanation, in the following description, a direction heading from the left to the right in FIG. 1A will be represented as an X direction, a direction heading from the top to the bottom in FIG. 1A will be represented as a Y direction, and a direction heading from the back to the front of the sheet of FIG. 1A will be represented as a Z direction.

The base member thin film 2 is formed with polyimide-based resin, for example, and has an insulating property. The base member thin film 2 is formed in a shape like a flat rectangular prism or a thin flat plate as a whole, and a side in the Z direction is by far shorter than a side in the X direction and a side in the Y direction. The length of the side in the Z direction is less than or equal to 20 [μm], for example. In the following description, a surface of the base member thin film 2 on the Z direction side (i.e., a surface on the front side) will be referred to as a "base member front surface 2A" or a "base member first surface", and a surface on the opposite side (i.e., a surface on the back side) will be referred to as a "base member back surface 2B" or a "base member second surface". The base member back surface 2B is formed extremely flat and its surface roughness (roughness) is desired to be less than or equal to 10 [nm].

Further, in a part of the base member thin film 2 roughly on the Y direction side (lower side in FIG. 1A), base member through holes 2V1, 2V2 and 2V3 are formed at three positions separate from each other in the X direction. Furthermore, in a part of the base member thin film 2 roughly on the −Y direction side (upper side in FIG. 1A), a base member through hole 2V4 is formed at a position. For convenience of the explanation, the base member through holes 2V1, 2V2, 2V3 and 2V4 will also be referred to collectively as "base member through holes 2V".

The base member through hole 2V as a penetration part, formed as a hole penetrating the base member thin film 2 in the Z direction, is a part that corresponds to a via in cases where the base member thin film 2 is regarded as a circuit board. Each of the base member through holes 2V1, 2V2 and 2V3 has a shape like a square as the shape as viewed in the Z direction, that is, the shape in FIG. 1A. In contrast, the shape of the base member through hole 2V4 as viewed in the Z direction is a rectangular shape that is long in the X direction. Incidentally, the shape of the base member through hole 2V4 is substantially the same as the shape of the base member through holes 2V1, 2V2 and 2V3 when connected together in the X direction.

Provided on the base member front surface 2A of the base member thin film 2 are a red light-emitting element 11, a green light-emitting element 12 and a blue light-emitting element 13, connection electrodes 21, 22, 23 and 24, interlayer insulation films 31 and 32, anode wiring members 41, 42 and 43, and cathode wiring members 44, 45 and 46.

On the base member front surface 2A of the base member thin film 2, the red light-emitting element 11, the green light-emitting element 12 and the blue light-emitting element 13 (hereinafter also referred to collectively as "light-emitting elements 10" or "elements") are arranged in the X direction with prescribed spacing between each other in the vicinity of a center of the base member front surface 2A in regard to the Y direction. Each of the red light-emitting element 11, the green light-emitting element 12 and the blue light-emitting element 13 is in a shape like a rectangular prism that is relatively long in the Y direction and relatively short in the X direction and in the Z direction, in which a part on the Z direction side (e.g., a part that is approximately ⅗ to ⅔ in a thickness direction) is removed in a part occupying a −Y direction side (e.g., an approximately ⅖ to ⅓ range on the −Y direction side). In other words, as shown in FIG. 1B, each of the red light-emitting element 11, the green light-emitting element 12 and the blue light-emitting element 13 has a shape in which the height in the Z direction is low in the approximately ⅖ to ⅓ range on the −Y direction side.

The red light-emitting element 11 is, for example, an element made of a material based on gallium arsenide (GaAs), such as a red light-emitting diode. The green light-emitting element 12 is, for example, an element made of a material based on gallium nitride (GaN), such as a green light-emitting diode. The blue light-emitting element 13 is, for example, an element made of a material based on gallium nitride (GaN), such as a blue light-emitting diode. Namely, the light-emitting elements constituting the light-emitting elements 10 are each formed with two or more types of materials different from each other.

In the red light-emitting element 11, on the surface on the Z direction side, a part occupying the vicinity of a center and the Y direction side is an anode terminal surface 11A, and a part occupying the −Y direction side is a cathode terminal surface 11K. Similarly, each of the green light-emitting element 12 and the blue light-emitting element 13 is provided with an anode terminal surface 12A, 13A and a cathode terminal surface 12k, 13K on the surface on the Z direction side.

The connection electrode 21 is made of a metallic material having electrical conductivity such as Au, Al, Cu, Ti or Pt and is provided so as to fill in the inside of the base member through hole 2V1 while stepping over to the base member front surface 2A's side in the vicinity of an outer periphery of the base member through hole 2V1, that is, so as to close and cover the base member through hole 2V1 and its vicinity from the Z direction side (i.e., from the base member front surface 2A's side). On the connection electrode 21, an electrode back surface 21B as a surface on the −Z direction side is formed extremely flat similarly to the base member back surface 2B and its surface roughness (roughness) is desired to be less than or equal to 10 [nm]. The connection electrode 21 includes an electrical path part (i.e., filling part) formed between the base member front surface 2A and the base member back surface 2B via the base member through hole 2V1 as the penetration part and a planar electrode surface 20B (e.g., with the surface roughness less than or equal to 10 [nm]) formed on the base member back surface 2B's side.

The connection electrode 22, 23 has a configuration similar to the connection electrode 21, and is formed so as to fill in the inside of the base member through hole 2V2, 2V3 while stepping over to the base member front surface 2A's side in the vicinity of an outer periphery of the base member through hole 2V2, 2V3. On the connection electrode 22, 23, an electrode back surface 22B, 23B as a surface on the −Z direction side is formed extremely flat (e.g., with the surface roughness less than or equal to 10 [nm]) similarly to the electrode back surface 21B.

The connection electrode 24 has a configuration like the connection electrode 21 expanded in the X direction, and is formed so as to fill in the inside of the base member through hole 2V4 while stepping over to the base member front surface 2A's side in the vicinity of an outer periphery of the base member through hole 2V4. On the connection electrode 24, an electrode back surface 24B as a surface on the −Z direction side is formed extremely flat (e.g., with the surface roughness less than or equal to 10 [nm]) similarly to the electrode back surface 21B.

For convenience of the explanation, the connection electrodes 21, 22, 23 and 24 will also be referred to collectively as "connection electrodes 20" or "electrodes". Further, in the following description, the electrode back surfaces 21B, 22B, 23B and 24B will also be referred to collectively as "electrode back surfaces 20B" or "electrode surfaces".

Further, in the composite integrated film 1, the base member back surface 2B of the base member thin film 2 and the electrode back surfaces 20B form substantially the same flat surface. This flat surface will hereinafter be referred to also as a "film back surface 1B". Specifically, in the composite integrated film 1, in regard to the connection electrode 24, for example, the distance between the base member back surface 2B and the electrode back surface 24B in regard to the Z direction (i.e., normal direction of the base member back surface 2B), namely, a film level difference LD as a "height of a level difference", is extremely small as shown in FIG. 1C magnifying the part B1 as a part of FIG. 1B.

Specifically, in the composite integrated film 1, the film level difference LD is desired to be less than or equal to 1/1000 in comparison with the shortest side on an XY plane (i.e., short side) in the external form of the base member back surface 2B, that is, the shorter one of a distance L2X as the length of a side in the X direction and a distance L2Y as the length of a side in the Y direction.

Each of the interlayer insulation films 31 and 32 is formed with an insulating material. In each of the red light-emitting element 11, the green light-emitting element 12 and the blue light-emitting element 13, the interlayer insulation film 31 is provided in a range extending from a surface on the Y direction side to a Y direction side part of a surface on the Z direction side. In each of the red light-emitting element 11, the green light-emitting element 12 and the blue light-emitting element 13, the interlayer insulation film 32 is provided in a range extending from a surface on the −Y direction side to a −Y direction side part of a surface on the Z direction side.

The anode wiring member 41 is formed with a metallic material having electrical conductivity such as Au, Al, Cu, Ti or Pt. The anode wiring member 41 is formed to continuously cover front surfaces of the red light-emitting element 11, the base member thin film 2 and the connection electrode 21, mostly in the Y direction, from a Y direction side part of a surface of the red light-emitting element 11 on the Z direction side to a −Y direction-deviated part of a surface of the connection electrode 21 on the Z direction side. In short, the anode wiring member 41 connects the anode terminal surface 11A of the red light-emitting element 11 and the front surface of the connection electrode 21 to each other, thereby electrically connecting the anode terminal surface 11A and the electrode back surface 21B.

The cathode wiring member 44 is formed with a metallic material having electrical conductivity similarly to the anode wiring member 41. The cathode wiring member 44 is formed to continuously cover front surfaces of the red light-emitting element 11, the base member thin film 2 and the connection electrode 24, mostly in the Y direction, from a −Y direction side part of a surface of the red light-emitting element 11 on the Z direction side to a −X direction-deviated and Y direction-deviated part of a surface of the connection electrode 24 on the Z direction side. In short, the cathode wiring member 44 connects the cathode terminal surface 11K of the red light-emitting element 11 and the front surface of the connection electrode 24 to each other, thereby electrically connecting the cathode terminal surface 11K and the electrode back surface 24B.

The anode wiring member 42 and the cathode wiring member 45, respectively configured similarly to the anode wiring member 41 and the cathode wiring member 44, are connected to the green light-emitting element 12. Namely, the anode wiring member 42 connects the anode terminal surface 12A of the green light-emitting element 12 and the front surface of the connection electrode 22 to each other, thereby electrically connecting the anode terminal surface 12A and the electrode back surface 22B. The cathode wiring member 45 connects the cathode terminal surface 12K of the green light-emitting element 12 and the front surface of the connection electrode 24 to each other, thereby electrically connecting the cathode terminal surface 12K and the electrode back surface 24B.

The anode wiring member 43 and the cathode wiring member 46, respectively configured similarly to the anode wiring member 41 and the cathode wiring member 44, are connected to the blue light-emitting element 13. Namely, the anode wiring member 43 connects the anode terminal surface 13A of the blue light-emitting element 13 and the front surface of the connection electrode 23 to each other, thereby electrically connecting the anode terminal surface 13A and the electrode back surface 23B. The cathode wiring member 46 connects the cathode terminal surface 13K of the blue light-emitting element 13 and the front surface of the connection electrode 24 to each other, thereby electrically connecting the cathode terminal surface 13K and the electrode back surface 24B.

For convenience of the explanation, the anode wiring members 41, 42 and 43 and the cathode wiring members 44, 45 and 46 will also be referred to collectively as "wiring members 40".

As above, in the composite integrated film 1, the light-emitting elements 10 for the three colors are provided on the base member front surface 2A's side of the base member thin film 2, and the electrode back surfaces 20B of the connection electrodes 20 electrically connected respectively to the light-emitting elements are exposed to the base member back surface 2B's side of the base member thin film 2 while forming substantially the same flat surface as the base member back surface 2B.

[1-2. Manufacture of Composite Integrated Film]

FIG. 2 is a flowchart showing a manufacturing procedure of the composite integrated film 1 according to the first embodiment. FIGS. 3A to 3F are schematic cross-sectional views showing a manufacturing process of the composite integrated film 1. As shown in FIG. 2 and FIGS. 3A to 3F, the composite integrated film 1 is formed stepwise on a formation substrate 51 by prescribed manufacturing equipment 50 according to various manufacturing processes similar to those for manufacturing generic semiconductors. Incidentally, the formation substrate 51 is formed with silicon similarly to the so-called wafer, and a formation surface 52 that is extremely flat is formed on a front surface of the formation substrate 51. The surface roughness of the formation surface 52 is desired to be less than or equal to 10 [nm].

Figure 3A:
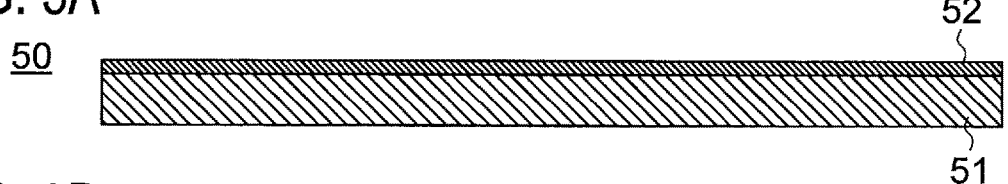
FIGS. 3A to 3F are schematic cross-sectional views showing a manufacturing process of the composite integrated film.
Figure 3B:
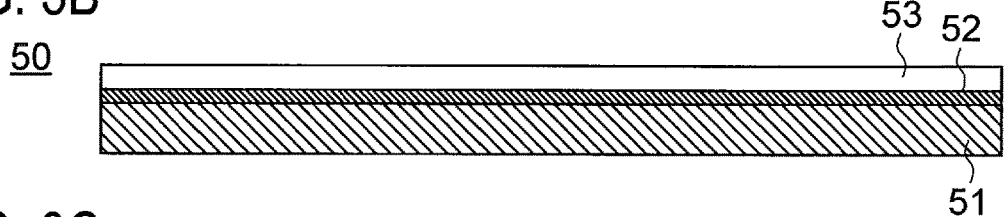

Specifically, upon starting the manufacturing procedure RT1 of the composite integrated film (FIG. 2), in the first step SP1, the manufacturing equipment 50 forms a thin film layer 53 with polyimide-based resin on the formation surface 52 of the formation substrate 51 as shown in FIG. 3B. In this step SP1, the manufacturing equipment 50 forms the thin film layer 53 with a thickness less than or equal to 20 [μm], for example, by using a spin coater (not shown) or the like, for example. At that time, a lower surface of the thin film layer 53 becomes extremely flat since the lower surface is formed while being in close contact with the formation surface 52.

Figure 3C:
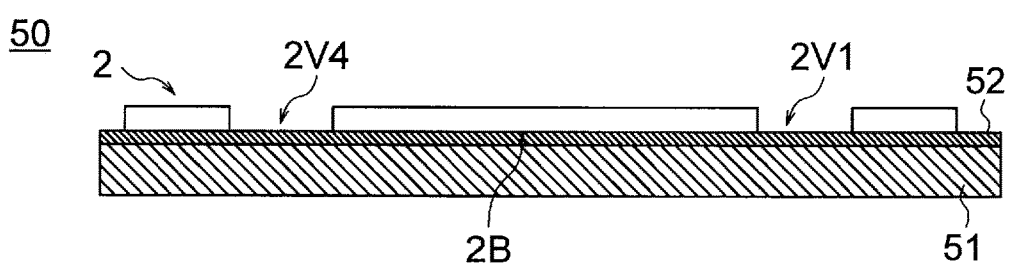

In step SP2, as shown in FIG. 3C, the manufacturing equipment 50 forms the base member thin film 2 by removing unnecessary parts from the thin film layer 53 by performing a patterning process by a method like lithography. In this step SP2, the base member through holes 2V (the base member through holes 2V1, 2V4, etc.) are formed in the base member thin film 2.

Figure 3D:
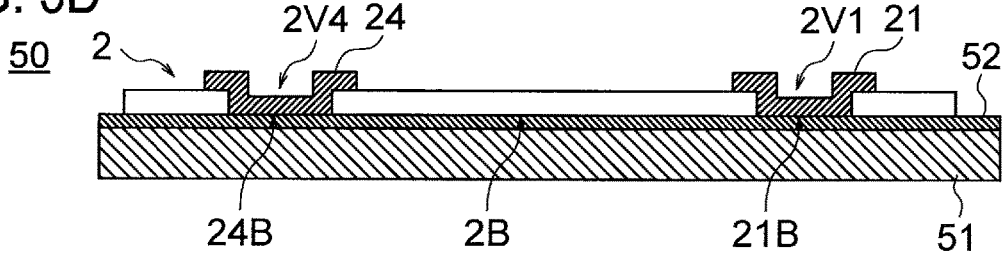

In step SP3, as shown in FIG. 3D, the manufacturing equipment 50 forms the connection electrodes 20 (the connection electrodes 21, 24, etc.) by depositing a metallic material in ranges respectively covering the base member through holes 2V by a method like lithography or vapor deposition, for example, and shifts to the next step SP4. At that time, a lower surface of the connection electrode 20 is formed while being in close contact with the formation surface 52 similarly to the case of the thin film layer 53. Therefore, the electrode back surfaces 20B (the electrode back surfaces 21B, 24B, etc.) as the lower surfaces of the connection electrodes 20 become extremely flat, and are situated on substantially the same flat surface as the lower surface of the thin film layer 53, that is, the base member back surface 2B of the base member thin film 2.

Figure 3E:
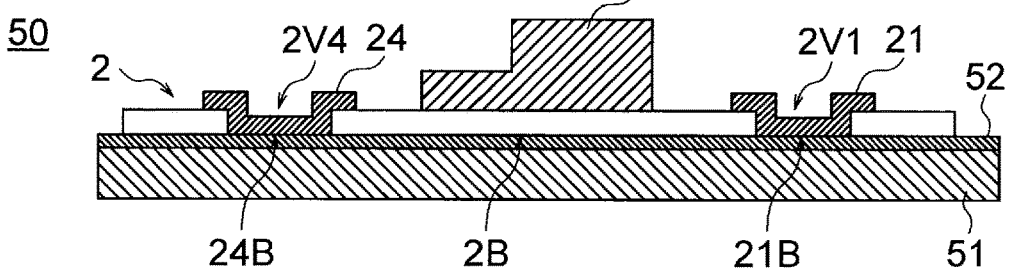

In the step SP4, as shown in FIG. 3E, the manufacturing equipment 50 transfers the light-emitting elements 10 (e.g., the red light-emitting element 11) manufactured by pre-scribed LED manufacturing equipment (not shown) or the like onto prescribed positions on the base member front surface 2A of the base member thin film 2, and shifts to the next step SP5. At that time, the manufacturing equipment 50 can use a commonly known transfer technology like that disclosed in the Patent Reference 1, for example.

Figure 3F:
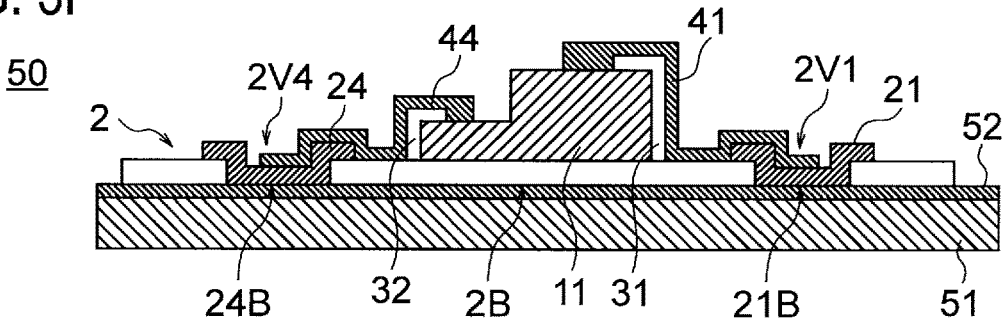

In the step SP5, as shown in FIG. 3F, the manufacturing equipment 50 forms the interlayer insulation films 31 and 32 with a prescribed insulating material by a method like lithography or vapor deposition, for example, and thereafter forms the wiring members 40 (the anode wiring member 41, the cathode wiring member 44, etc.) with a prescribed metallic material. Thereafter, the manufacturing equipment 50 shifts to the next step SP6 and ends the manufacturing procedure RT1 of the composite integrated film. In the composite integrated film 1 manufactured as above, the base member back surface 2B and the electrode back surfaces 20B are in a state of being in contact with the surface (i.e., the formation surface 52) of the formation substrate 51.

Figure 4:
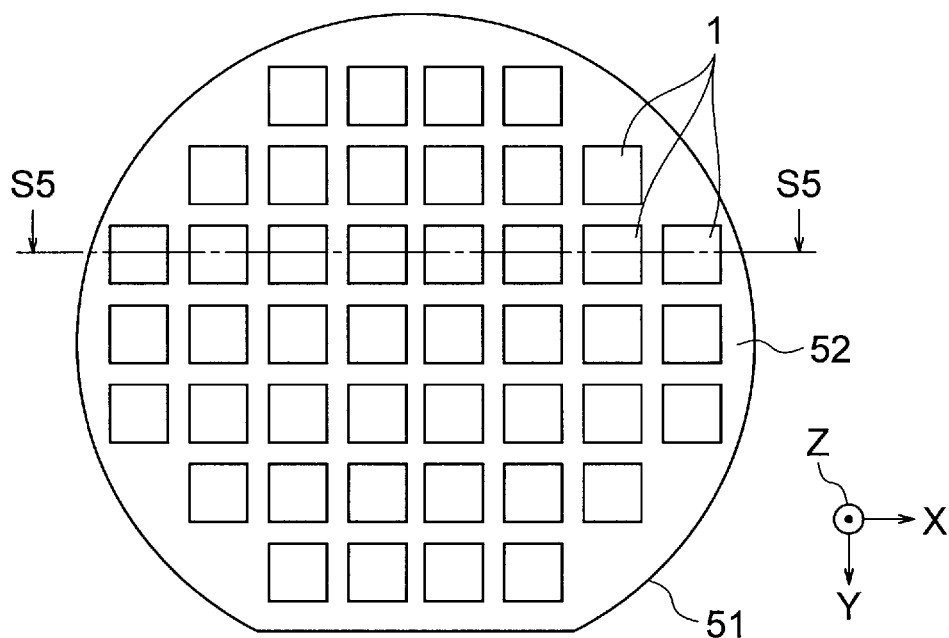
FIG. 4 is a schematic plan view showing arrangement of the composite integrated films on a wafer.
Figure 5:
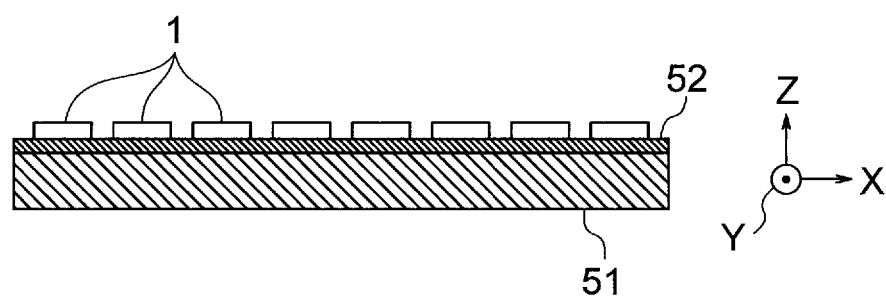
FIG. 5 is a schematic cross-sectional view slicing the wafer of FIG. 4 along the line S5-S5.

FIG. 4 is a schematic plan view showing arrangement of the composite integrated films 1 on a wafer 51. FIG. 5 is a schematic cross-sectional view slicing the wafer of FIG. 4 along the line S5-S5. The manufacturing equipment 50 manufactures a plurality of composite integrated films 1 in a lump based on one formation substrate 51 (which corresponds to the so-called silicon wafer) similarly to cases of manufacturing generic semiconductor elements. Specifically, as shown in FIG. 4 and FIG. 5, the manufacturing equipment 50 manufactures a plurality of composite integrated films 1 in a state of being arrayed like a grid, for example, by simultaneously executing or successively executing processes for manufacturing the plurality of composite integrated films 1 on the formation substrate 51 as the wafer. The wafer 51 and the plurality of composite integrated films 1 constitute a composite integrated film supply wafer. At least either the base member back surfaces 2B or the electrode surfaces 20B (21B-24B) of the plurality of composite integrated films 1 and the formation surface 52 as the surface of the wafer 51 are in contact with each other. Here, the surface roughness of the formation surface 52 of the wafer 51 is desired to be less than or equal to 10 [nm].

[1-3. Configuration of LED Display Device]

Figure 6:
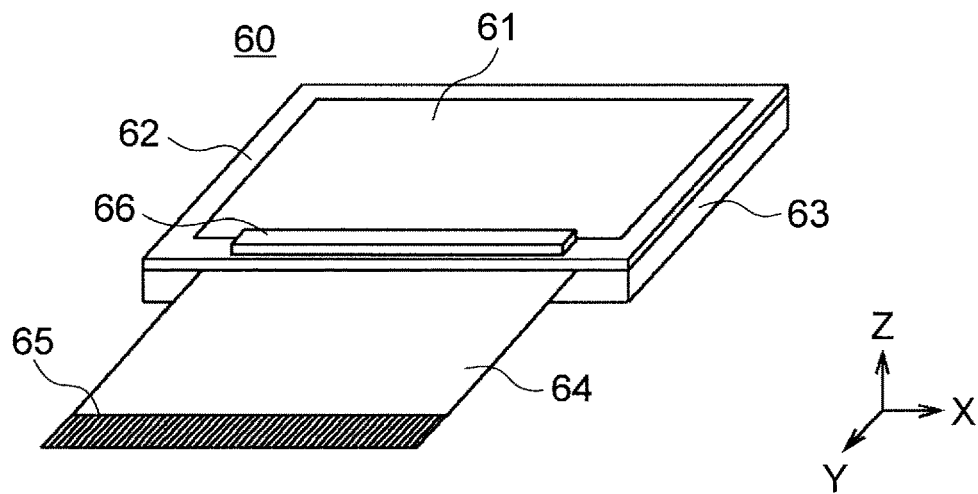
FIG. 6 is a schematic perspective view showing the configuration of an LED display device.

Next, an LED display device 60 in which a plurality of composite integrated films 1 have been installed will be described below. FIG. 6 is a schematic perspective view showing the configuration of the LED display device 60. As shown in FIG. 6, the LED display device 60 as a semiconductor composite device includes an LED display type display unit 61 (also referred to "display screen"), a frame 62, a heat radiation member 63, a connection cable 64, a connection terminal unit 65, a display driver 66, and so forth. The LED display device 60, which is referred to also as a micro-LED display, is a display device in which a set of LED elements of red, green and blue is provided corresponding to one pixel.

The LED display type display unit 61 has a configuration in which a great number of composite integrated films 1 (FIG. 1A) are installed to be arranged like a grid in a display region that is set on a surface of a planar circuit board on the Z direction side (details will be described later). The frame 62 is formed in a shape like a rectangular frame with a prescribed steel material or the like, for example, and is attached to the LED display type display unit 61 to surround the outer periphery of the display region on the Z direction side of the LED display type display unit 61.

The heat radiation member 63 is formed in a shape like a flat rectangular prism as a whole with a metallic material having relatively high thermal conductivity like aluminum, for example. The heat radiation member 63 is set to be in contact with the LED display type display unit 61 on the −Z direction side of the LED display type display unit 61, that is, on a side opposite to the surface for displaying images and the like. The connection cable 64 is electrically connected to a prescribed control device (not shown) via the connection terminal unit 65 and thereby transmits and supplies an image signal, supplied from the control device, to the display driver 66.

The display driver 66 as a drive circuit is electrically connected to the connection cable 64 and the LED display type display unit 61. For example, the display driver 66 generates drive signals of red, green and blue based on the image signal supplied via the connection cable 64 and supplies drive currents based on these drive signals to the LED display type display unit 61. Consequently, the LED display device 60 is capable of displaying an image based on the image signal supplied from the control device (not shown) or the like in the display region of the LED display type display unit 61.

Figure 7:
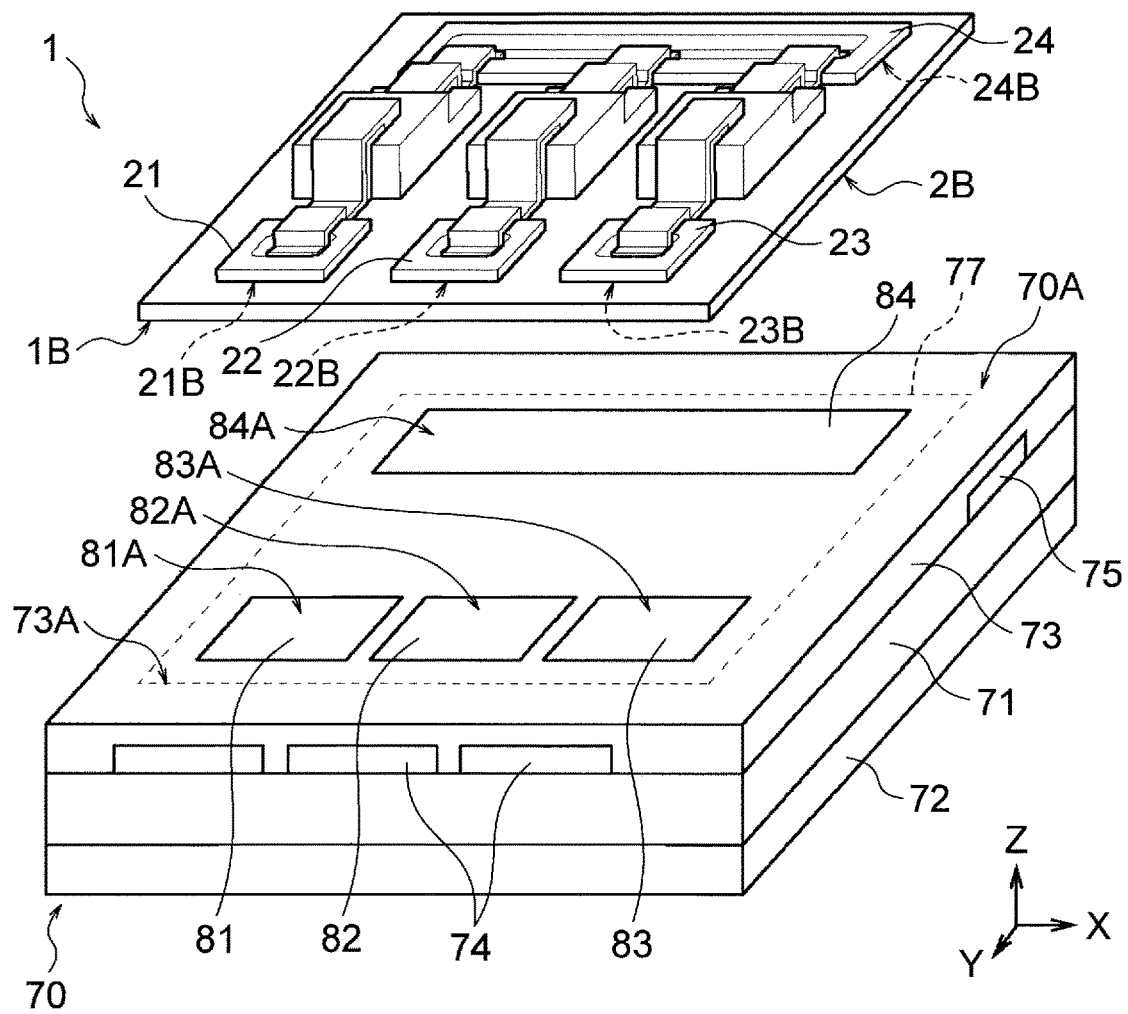
FIG. 7 is a schematic perspective view showing a process of sticking the composite integrated film on a circuit board.
Figure 8:
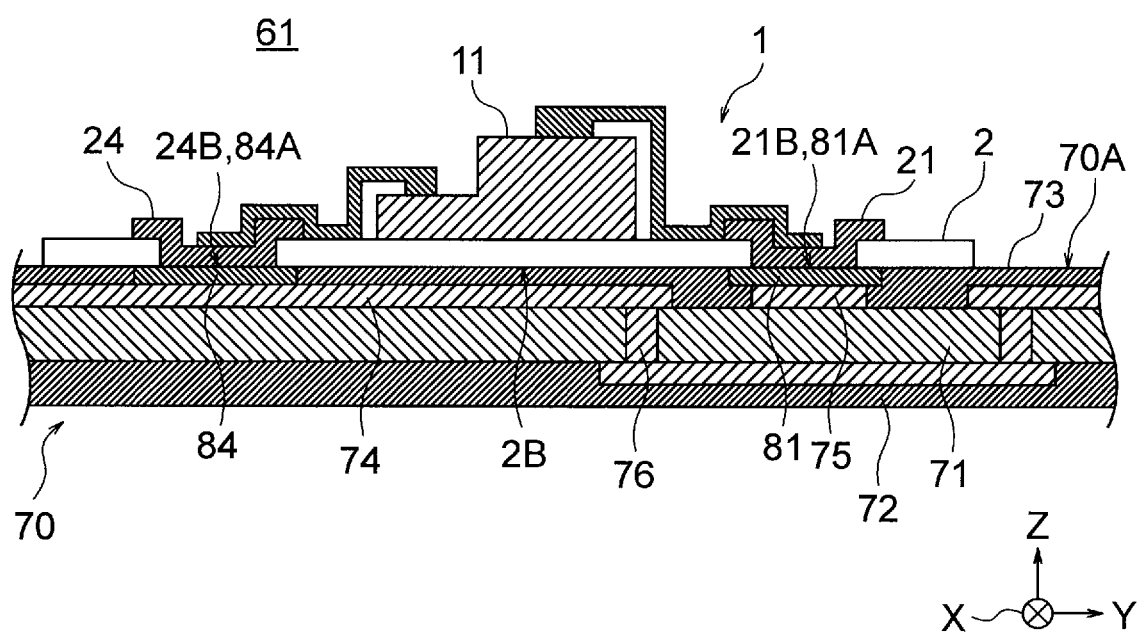
FIG. 8 is a schematic cross-sectional view showing the process of sticking the composite integrated film 1 on the circuit board.

Next, the configuration of the LED display type display unit 61 will be described below. FIG. 7 is a schematic perspective view showing a process of sticking the composite integrated film 1 on a circuit board. FIG. 8 is a schematic cross-sectional view showing the process of sticking the composite integrated film 1 on the circuit board. As shown in FIG. 7 and FIG. 8, the LED display type display unit 61 has a configuration in which the composite integrated films 1 have been stuck on a surface of a circuit board 70 on the Z direction side. Incidentally, FIG. 7 shows one composite integrated film 1 and a part of the circuit board 70 corresponding to the composite integrated film 1 as an extract from the LED display type display unit 61. FIG. 7 shows a state before the composite integrated film 1 is stuck on the circuit board 70. FIG. 8 shows a cross section corresponding to FIG. 1B.

The circuit board 70 has a configuration in which surfaces of a base member part 71 on the −Z direction side and the opposite side are respectively covered by insulation layers 72 and 73. The base member part 71 is formed with the so-called glass epoxy resin, that is, formed by impregnating glass fiber with epoxy resin and thermally hardening the impregnated glass fiber, for example, and has sufficient strength, insulation performance, etc. The insulation layers 72 and 73 are formed with thermosetting epoxy resin, for example, and have sufficient insulation performance.

Inside the circuit board 70, a plurality of wiring members are provided, such as column wiring members 74 arranged mainly in the Y direction on a front surface and a back surface of the base member part 71, row common wiring members 75 arranged mainly in the X direction, and internal wiring members 76 arranged to penetrate the base member part 71. Among these wiring members, the column wiring members 74 and the row common wiring members 75 form an approximately grid-like wiring pattern. These wiring members are formed with a material having electrical conductivity, and are electrically connected to each other in an appropriate manner. For convenience of the explanation, the column wiring member 74 and the row common wiring member 75 will be referred to also as a "first direction wire" and a "second direction wire", respectively.

In the circuit board 70, a region corresponding to one composite integrated film 1 (referred to as a "sticking region 77") is provided with three column wiring connection pads 81, 82 and 83 and one row common wiring connection pad 84. The column wiring connection pads 81, 82 and 83 are made of a material having electrical conductivity, expose their pad front surfaces 81A, 82A and 83A to a surface of the circuit board 70 on the Z direction side (referred to as a "substrate front surface 70A"), and are electrically connected to the column wiring members 74 inside the circuit board 70. The row common wiring connection pad 84 is made of a material having electrical conductivity, exposes its pad front surfaces 84A to the substrate front surface 70A of the circuit board 70, and is electrically connected to the row common wiring member 75 inside the circuit board 70.

For convenience of the explanation, the column wiring connection pads 81, 82 and 83 and the row common wiring connection pad 84 will be referred to collectively as "connection pads 80", and the pad front surfaces 81A, 82A, 83A and 84A will be referred to collectively as "pad front surfaces 80A".

Incidentally, in the circuit board 70, the positions of the pad front surfaces 81A, 82A, 83A and 84A in the sticking region 77 are in a mirror image relationship with the positions of the electrode back surfaces 21B, 22B, 23B and 24B on the film back surface 1B of the composite integrated film 1. Further, in the circuit board 70, the sizes of the pad front surfaces 81A, 82A, 83A and 84A in the sticking region 77 are equivalent to or one size larger than the sizes of the electrode back surfaces 21B, 22B, 23B and 24B on the film back surface 1B of the composite integrated film 1.

Furthermore, in the circuit board 70, the substrate front surface 70A is formed in an extremely flat planar shape. Namely, in the circuit board 70, both of an insulation front surface 73A as a surface of the insulation layer 73 on the Z direction side and the pad front surface 80A are extremely flat, are planes (i.e., flat surfaces) parallel to each other, and the distance (i.e., level difference) between them in regard to the Z direction is also extremely small.

[1-4. Manufacture of Circuit Board and LED Display Type Display Unit]

Figure 9A:
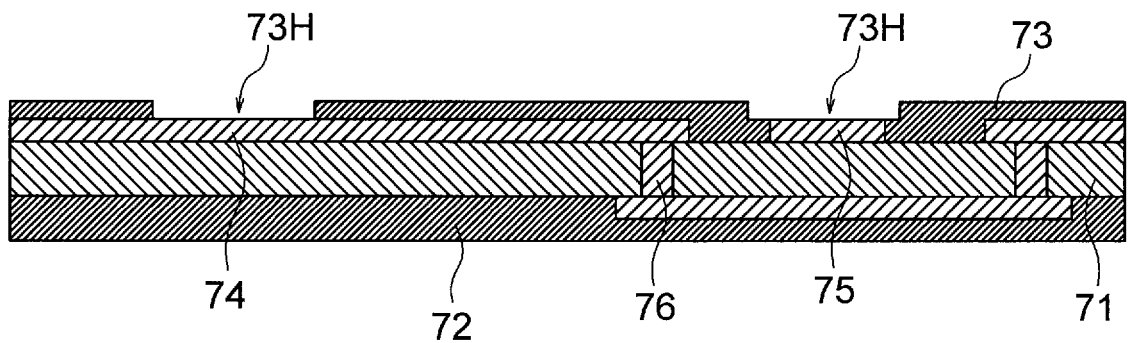
FIGS. 9A to 9C are schematic cross-sectional views showing a manufacturing process of the circuit board.
Figure 9B:
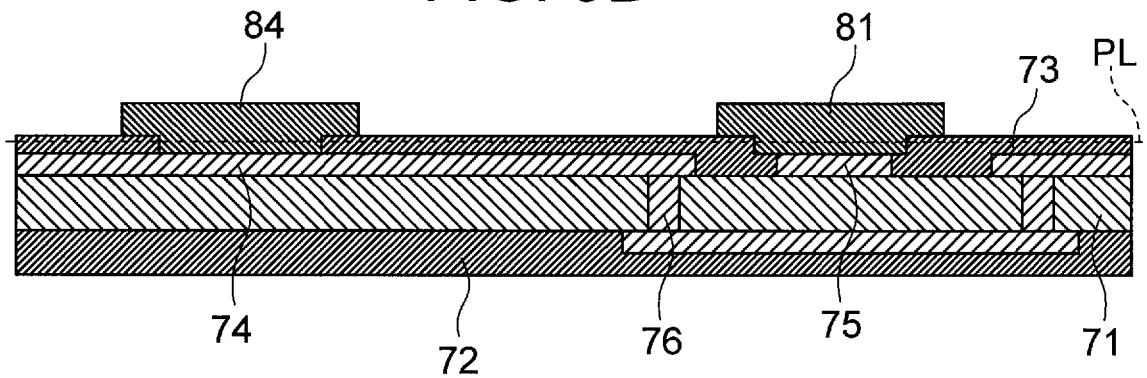
Figure 9C:
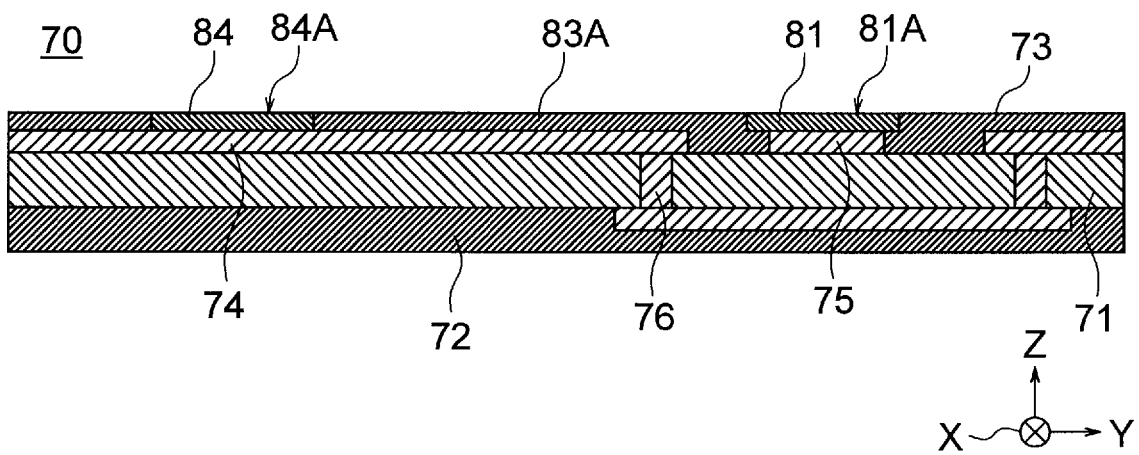

Next, the manufacture of the circuit board 70 and the LED display type display unit 61 will be respectively described below. FIGS. 9A to 9C are schematic cross-sectional views showing a manufacturing process of the circuit board. First, the circuit board 70 is manufactured by circuit board manufacturing equipment 90 through a plurality of processes as shown in FIGS. 9A to 9C, for example. The circuit board manufacturing equipment 90 uses commonly known semiconductor manufacture technologies such as technologies like photolithography, vapor deposition, masking and etching, or various technologies regarding the manufacture of circuit boards.

Specifically, first, as shown in FIG. 9A, the circuit board manufacturing equipment 90 forms the base member part 71 by a method like etching into a state in which wiring members are arranged on the surfaces of and inside the base member part 71 and the surfaces of the base member part 71 are mostly covered by the insulation layers 72 and 73. However, at that time, the circuit board 70 is in a state in which there have been formed aperture parts 73H, where wiring members are exposed without being covered by the insulation layer 73, at positions where the connection pads 80 will be provided.

Subsequently, as shown in FIG. 9B, on the Z direction side of the base member part 71, the circuit board manufacturing equipment 90 deposits a material having electrical conductivity, such as metal, on the aperture parts 73H and their vicinities and thereby fills in the inside of the aperture parts 73H with the material.

Further, the circuit board manufacturing equipment 90 executes processing like chemical mechanical polishing so that a polish line PL shown in FIG. 9B becomes the surface on the Z direction side. Consequently, the circuit board manufacturing equipment 90 is capable of manufacturing the circuit board 70 in which the substrate front surface 70A is extremely flat, namely, both of the insulation front surface 73A and the pad front surface 80A are extremely flat, and the level difference between them is extremely small as shown in FIG. 9C. Specifically, in the circuit board 70, the surface roughness (roughness) of the insulation front surface 73A and that of the pad front surface 80A are both desired to be less than or equal to 10 [nm]. Further, in the circuit board 70, the distance between the insulation front surface 73A and the pad front surface 80A in regard to the Z direction (i.e., normal direction of the insulation front surface 73A), namely, a substrate level difference as the "level difference or level difference height", is desired to be less than or equal to 1/1000 in comparison with the shorter one of the distance L2X and the distance L2Y (i.e., the shortest side) in the composite integrated film 1 (FIG. 1A).

The circuit board 70 is provided with as many sticking regions 77 as the pixels (picture elements) forming an image. For example, when the circuit board 70 supports a resolution compatible with the so-called 4k (3840×2160 pixels), the sticking regions 77 (FIG. 7) are arranged like a grid having 3840 grid points in the X direction and 2160 grid points in the Y direction.

Figure 10:
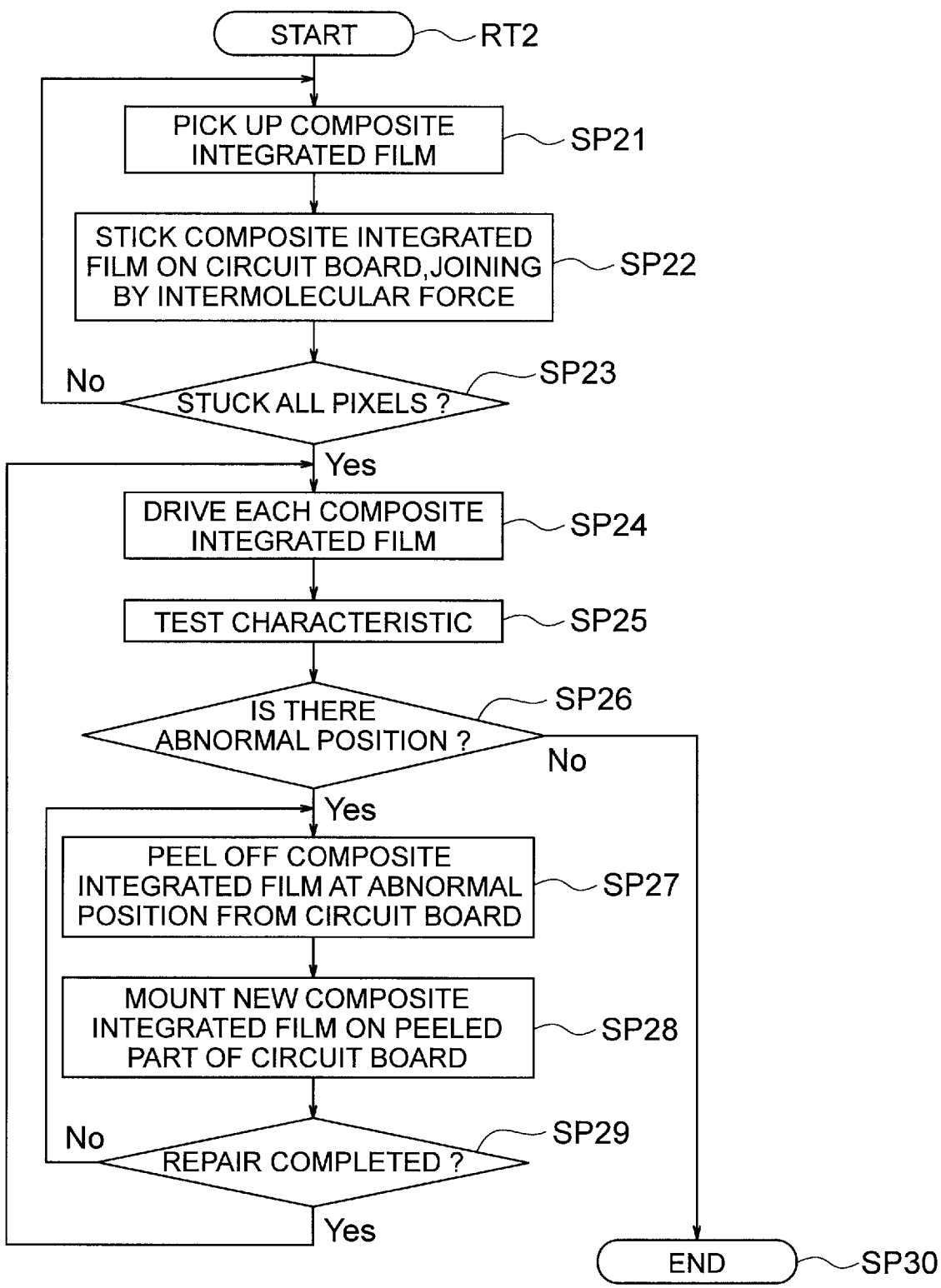
FIG. 10 is a flowchart showing a manufacturing procedure of the LED display device.

Next, the manufacture of the LED display device 60 will be described below. FIG. 10 is a flowchart showing a manufacturing procedure of the LED display device 60. FIGS. 11A to 11E are schematic diagrams showing a manufacturing process of the LED display device 60. As shown in FIG. 10 and FIGS. 11A to 11E, the LED display type display unit 61 is manufactured by prescribed display manufacturing equipment 100 stepwise through a plurality of processes.

In the display manufacturing equipment 100, the circuit board 70 (FIG. 7 and FIG. 8) is set at a prescribed circuit board setting position with the surface of the insulation layer 73 facing upward, while the formation substrate 51 (FIG. 4 and FIG. 5) is set at a prescribed formation substrate setting position with the face of the formation surface 52 facing upward.

Figure 11A:
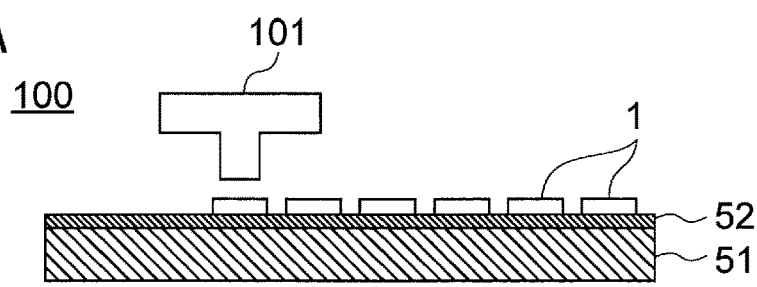
FIGS. 11A to 11E are schematic diagrams showing a manufacturing process of the LED display device.

Upon starting the manufacturing procedure RT2 of the LED display type display unit (FIG. 2), the display manufacturing equipment 100 shifts to the first step SP21, picks up one composite integrated film 1 from the formation substrate 51 by using a transfer stamp 101 as shown in FIG. 11A, and shifts to the next step SP22.

Figure 11B:
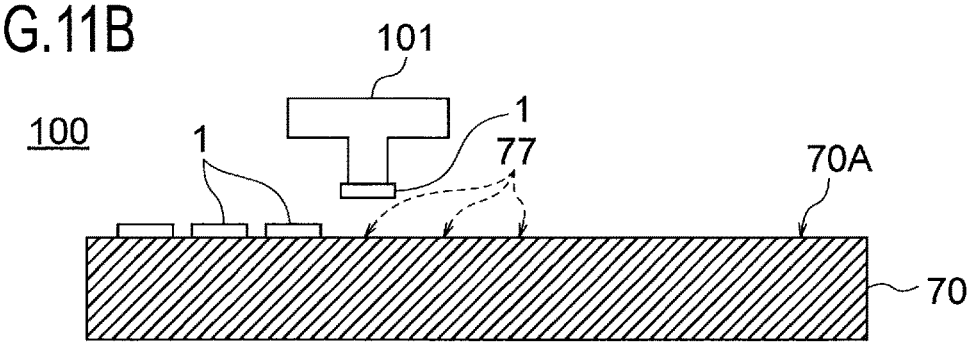

In the step SP22, the display manufacturing equipment 100 sticks the composite integrated film 1 on the circuit board 70 as shown in FIG. 11B, and shifts to the next step SP23. Specifically, first, the display manufacturing equipment 100 moves the transfer stamp 101 that picked up one composite integrated film 1 to a position above (on the Z direction side of) a sticking region 77 of the circuit board 70 on which no composite integrated film 1 has been stuck yet. This brings the composite integrated film 1 to a state in which the base member back surface 2B and the electrode back surfaces 20B respectively face the insulation front surface 73A and the pad front surfaces 80A of the circuit board 70 as shown in FIG. 7.

Subsequently, the display manufacturing equipment 100 moves the transfer stamp 101 downward and thereby makes the film back surface 1B of the composite integrated film 1 contact the substrate front surface 70A of the circuit board 70 and makes the base member back surface 2B and the electrode back surfaces 20B respectively contact the insulation front surface 73A and the pad front surfaces 80A as shown in FIG. 8.

Further, the display manufacturing equipment 100 makes the transfer stamp 101 apply prescribed pressure to (press against) the composite integrated film 1 in the −Z direction (i.e., downward). Accordingly, intermolecular forces act between the base member back surface 2B and the insulation front surface 73A and between the electrode back surfaces 20B and the pad front surfaces 80A, and the composite integrated film 1 is stuck on the circuit board 70 by the intermolecular forces.

At that time, the electrode back surfaces 20B are electrically connected respectively to the pad front surfaces 80A by the bonding by the intermolecular forces. Namely, the connection electrodes 21, 22 and 23 are electrically connected respectively to the column wiring connection pads 81, 82 and 83. Further, the connection electrode 24 is electrically connected to the row common wiring connection pad 84.

In the step SP23, the display manufacturing equipment 100 judges whether or not the composite integrated films 1 have been stuck on all the sticking regions 77 of the circuit board 70. When a negative result is obtained by the judgment, the display manufacturing equipment 100 successively sticks the composite integrated films 1 on remaining sticking regions 77 by returning to the step SP21 and repeating the series of processes.

Figure 11C:
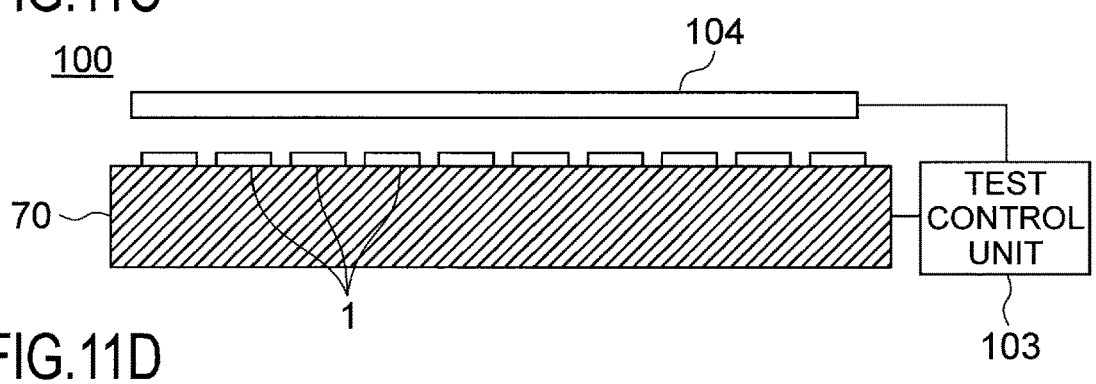

In contrast, when an affirmative result is obtained in the step SP23, it means that sticking the composite integrated films 1 on all sticking regions 77 of the circuit board 70 is completed. In this case, the display manufacturing equipment 100 shifts to the next step SP24, drives each composite integrated film 1 by connecting a test control unit 103 to the circuit board 70 as shown in FIG. 11C and supplying a prescribed image signal to the circuit board 70, and shifts to the next step SP25.

In the step SP25, the display manufacturing equipment 100 tests a characteristic of each composite integrated film 1, and shifts to the next step SP25. Specifically, the display manufacturing equipment 100 places a light receiving unit 104 at a position to face the circuit board 70, detects information such as the amount of light received from each composite integrated film 1, and obtains the characteristic of each composite integrated film 1 based on the detected information.

In the step SP26, the display manufacturing equipment 100 judges whether or not there is a position from which a normal characteristic was not obtained, namely, an abnormal position (referred to also as a defective position), based on the characteristic obtained from each composite integrated film 1. Specifically, the display manufacturing equipment 100 uses, for example, the magnitude of the light amount obtained with respect to the current supplied to the composite integrated film 1 as the characteristic, and has previously stored a normal range in regard to this characteristic. Then, the display manufacturing equipment 100 judges the position of the composite integrated film 1 having the characteristic outside the normal range as an abnormal position.

When an affirmative result is obtained by the judgment, it means that repair work has to be performed on the abnormal position, specifically, that the composite integrated film 1 at the abnormal position should be changed (i.e., replaced). In this case, the display manufacturing equipment 100 shifts to the next step SP27.

Figure 11D:
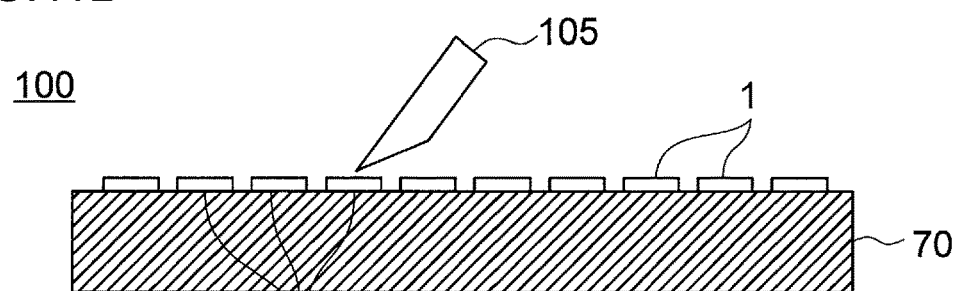
Figure 11E:
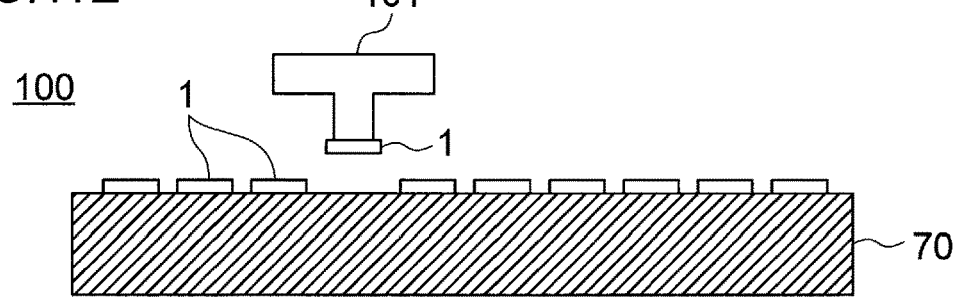

In the step SP27, the display manufacturing equipment 100 peels off the composite integrated film 1 at the abnormal position from the circuit board 70, and shifts to the next step SP28. Specifically, the display manufacturing equipment 100 first places a peeling head 105 close to the abnormal position as shown in FIG. 11D and lowers the bonding force of the composite integrated film 1 to the circuit board 70 by discharging a prescribed solvent towards the abnormal position. Subsequently, as shown in FIG. 11E, the display manufacturing equipment 100 peels off the composite integrated film 1 from the circuit board 70 by moving the transfer stamp 101 to the abnormal position, moving the transfer stamp 101 in the −Z direction, making the transfer stamp 101 suck the composite integrated film 1, and moving the transfer stamp 101 in the Z direction.

At that time, even though the bonding with the film back surface 1B of the composite integrated film 1 by the intermolecular forces is removed, the substrate front surface 70A of the circuit board 70 is hardly damaged and maintains its physical shape excellently. In other words, the circuit board 70 is capable of maintaining the extremely flat state at the abnormal position, on all of the insulation front surface 73A and the pad front surfaces 80A. Thereafter, the display manufacturing equipment 100 conveys the peeled composite integrated film 1 to a prescribed abnormal film collection part.

In the step SP28, the display manufacturing equipment 100 sticks a new composite integrated film 1 on the abnormal position of the circuit board 70, that is, the position from which the former composite integrated film 1 was peeled off, and shifts to the next step SP29. Specifically, the display manufacturing equipment 100 sticks the new composite integrated film 1 on the abnormal position of the circuit board 70 and has the electrode back surfaces 20B of the composite integrated film 1 and the pad front surfaces 80A of the circuit board 70 bonded to each other by the intermolecular forces by executing the same process as the step SP21 and the step SP22.

In the step SP29, the display manufacturing equipment 100 judges whether or not the repair work has been completed for all of the detected abnormal positions. When a negative result is obtained by the judgment, the display manufacturing equipment 100 executes the changing (replacement) of the composite integrated film 1 also for the remaining abnormal positions by returning to the step SP27 and repeating the series of processes.

In contrast, when an affirmative result is obtained in the step SP29, it means that the process of replacing the composite integrated film 1 has been completed at all the abnormal positions and thus the test of the characteristic has to be performed again. In this case, the display manufacturing equipment 100 returns to the step SP24 and repeats the series of processes. Incidentally, when the display manufacturing equipment 100 executes the process of the step SP25 second time or later, the display manufacturing equipment 100 may test the characteristic exclusively at the abnormal positions detected in the previous test.

In contrast, when a negative result is obtained in the step SP26, it means that the characteristics of all the composite integrated films 1 stuck on the circuit board 70 are in the normal range and the composite integrated films 1 are capable of normally operating as the LED display type display unit 61, namely, that the LED display type display unit 61 has been completed. In this case, the display manufacturing equipment 100 shifts to the next step SP30.

In the step SP30, the display manufacturing equipment 100 ends the LED display type display unit manufacturing procedure RT2. Incidentally, the display manufacturing equipment 100 is capable of successively manufacturing LED display type display units 61 by repeatedly executing this LED display type display unit manufacturing procedure RT2.

[1-5. Effect and Other Features]

In the above-described configuration, in the composite integrated film 1 according to the first embodiment, the film back surface 1B made up of the base member back surface 2B and the electrode back surfaces 20B is formed extremely flat.

Specifically, in the composite integrated film 1, the base member back surface 2B and the electrode back surface 20B are formed as planes (i.e., flat surfaces) parallel to each other, the surface roughness on each of them is made to be less than or equal to 10 [nm], and the level difference as the distance between them in regard to the Z direction is made to be less than or equal to 1/1000 of a short side (e.g., shortest side) on an XY plane in the external form of the base member back surface 2B.

Further, in the circuit board 70 according to this embodiment, the substrate front surface 70A made up of the insulation front surface 73A and the pad front surfaces 80A is formed extremely flat. Specifically, in the circuit board 70, by executing the chemical mechanical polishing (FIG. 9C), the insulation front surface 73A and the pad front surface 80A are formed as planes (i.e., flat surfaces) parallel to each other, the surface roughness on each of them is made to be less than or equal to 10 [nm], the distance between them in regard to the Z direction (i.e., level difference) is also made to be extremely small, and a substantially single flat plane (i.e., a single flat surface or a same flat surface) is formed.

Accordingly, in the LED display type display unit 61 according to this embodiment, the electrode back surfaces 20B of the composite integrated film 1 and the pad front surfaces 80A of the circuit board 70 can be bonded by the intermolecular forces and physically and electrically connected to each other by just placing the composite integrated film 1 in contact with the sticking region 77 of the circuit board 70 and applying prescribed pressure. In other words, in the LED display type display unit 61, the composite integrated film 1 and the circuit board 70 can be electrically connected to each other by just sticking the composite integrated film 1 on the circuit board 70, without the need of executing a wiring formation process by use of bonding wires and lithography, an annealing process for improving the degree of contact between a semiconductor surface and a wiring material, and so forth. Therefore, in the LED display type display unit 61, applying high temperature to the circuit board 70 is unnecessary and causing serious damage to the circuit board 70 can be avoided.

In this case, in the LED display type display unit 61, there is a possibility that a boundary line between the base member back surface 2B and the electrode back surface 20B on the composite integrated film 1 and a boundary line between the insulation front surface 73A and the pad front surface 80A on the circuit board 70 do not necessarily coincide with each other. Namely, in the LED display type display unit 61, there is a possibility that the boundary line between the base member back surface 2B and the electrode back surface 20B makes contact with the pad front surface 80A, for example. However, on the composite integrated film 1, the base member back surface 2B is extremely flat similarly to the electrode back surface 20B and the level difference between the base member back surface 2B and the electrode back surface 20B is extremely small. Therefore, in the LED display type display unit 61, the bonding between the pad front surface 80A and the electrode back surface 20B by the intermolecular forces is not impeded by the base member back surface 2B and the bonding force between the composite integrated film 1 and the circuit board 70 can be rather increased due to intermolecular forces acting between the pad front surface 80A and the base member back surface 2B.

Further, in the LED display type display unit 61, the intermolecular forces to the base member back surface 2B of the composite integrated film 1 can act also in a part of the circuit board 70 other than the pad front surfaces 80A, that is, also on the insulation front surface 73A. Accordingly, in the LED display type display unit 61, the state with the composite integrated films 1 stuck on the circuit board 70 can be maintained excellently.

Incidentally, there are cases where an adhesive agent is used for bonding two objects to each other. As the adhesive agent, there are adhesive agents that exhibit the adhesive function by using the intermolecular forces. Further, the adhesive agent is generally in the form of liquid, and the adhesive agent is applied to bonding surfaces of the two objects, is made to harden in a state of being sandwiched between the bonding surfaces, and thereby reaches the state of bonding the two objects together. When such an adhesive agent is used, in order to separate the already bonded objects from each other, it is necessary to physically break the hardened adhesive agent and there is a danger of damaging the objects when breaking the hardened adhesive agent.

Furthermore, at a part where electrical joining such as joining of electrodes of a circuit board and electrodes of an element is required, for example, alloy due to a eutectic of the electrodes is formed by bump connection in many cases. In such cases, although it is possible to remove the bump connection by laser removal or the like, for example, damage is caused to no small extent especially to the electrodes of the circuit board.

In contrast, the LED display type display unit 61 according to this embodiment realizes the physical and electrical connection by placing the film back surface 1B of the composite integrated film 1 and the substrate front surface 70A of the circuit board 70 in direct connection with each other and letting the intermolecular forces directly act between the film back surface 1B and the substrate front surface 70A, without using such an adhesive agent. Thus, in this embodiment, when an abnormal position (defective position) is detected in the manufacturing process of the LED display type display unit 61, the composite integrated film 1 can be peeled off with extreme ease and practically without damaging the circuit board 70, and a new composite integrated film 1 can be stuck on the same position (FIG. 10 and FIGS. 11A to 11E).

Further, when no abnormal position is detected in the manufacturing process of the LED display type display unit 61, the LED display type display unit 61 immediately becomes the finished product (FIG. 10, step SP26). In other words, in the manufacturing process of the LED display type display unit 61, by the joining of the composite integrated films 1 to the circuit board 70 by the intermolecular forces, the LED display type display unit 61 reaches a state in which the composite integrated films 1 and the circuit board 70 are electrically connected to each other and the joined state can be maintained to some extent. With the LED display type display unit 61 in this state, it is possible to execute the operation test by supplying current to each composite integrated film 1 and to change each composite integrated film 1 practically without damaging the circuit board 70. Furthermore, in the LED display type display unit 61, a part that has been confirmed to include no abnormal position can immediately be considered to be in the completed state, that is, a state in which there is no defective position and each composite integrated film 1 is fixed with necessary and sufficient strength, since the provisional fixation condition has sufficient joint strength. Consequently, the LED display type display unit 61 is capable of significantly decreasing the defective product occurrence rate and remarkably increasing the ratio of non-defective products (the so-called manufacturing yield).

Moreover, when an abnormal position is detected in the manufacturing process of the LED display type display unit 61, the defect can be eliminated by peeling off the composite integrated film 1 at the abnormal position through the removal of the bonding by the intermolecular forces and sticking a new composite integrated film 1 on the same position. Therefore, in the LED display type display unit 61, it is unnecessary to provide redundant circuits, redundant elements, etc. disclosed in the Patent Reference 1 and the Patent Reference 2, and the spacing between the sticking regions 77 on the circuit board 70 can be reduced to the bare minimum. Consequently, in the LED display type display unit 61 and the LED display device 60 equipped with the LED display type display unit 61, it is possible to increase the degree of integration of the display pixels, i.e., the packaging density or the pixel density, and to display high-resolution images.

Parenthetically, in regard to the composite integrated film 1, it is also possible to consider, for example, a method like providing a circuit for detecting a defect, pads for letting probes make contact thereto, or the like on the composite integrated film and executing the test at a stage before sticking the composite integrated film on the circuit board 70. However, in this method, the area of the composite integrated film increases for providing the circuit, pads or the like, and thus the pixel density in the state of having been stuck on the LED display type display unit 61 decreases. Further, since this method requires to precisely place tester probes or the like in contact with the pads or the like at the time of the test, there is a possibility to cause a great increase in the number of man-hours for the work.

In contrast, in this embodiment, the test is conducted in the state in which the composite integrated films 1 have been stuck on the circuit board 70 to be used as the actual product, and the changing of the composite integrated film 1 is not executed if the test result is normal, and thus the manufacture can be carried out with extremely high efficiency.

Further, in this embodiment, it is unnecessary to provide extra circuits, probes or the like, and thus the area of the base member thin film 2, namely, the area necessary for one pixel, can be reduced to the minimum and the pixel density in the state of having been stuck on the LED display type display unit 61 can be increased.

Furthermore, in the manufacturing process, the composite integrated film 1 is manufactured in a way like successively stacking parts on the formation surface 52 formed extremely flat (FIG. 2 and FIG. 3). Therefore, the composite integrated film 1 does not require to specially execute a process for flattening the film back surface 1B, and can be manufactured with ease in the state in which the film back surface 1B is extremely flat, namely, all of the base member back surface 2B and the electrode back surfaces 20B are extremely flat, and the level difference between the base member back surface 2B and the electrode back surface 20B is extremely small.

According to the configuration described above, in the composite integrated film 1, the film back surface 1B made up of the base member back surface 2B and the electrode back surfaces 20B is formed extremely flat. Further, in the circuit board 70, the substrate front surface 70A made up of the insulation front surface 73A and the pad front surfaces 80A is formed extremely flat. Therefore, in the LED display type display unit 61, the characteristic of each composite integrated film 1 can be tested by operating the composite integrated film 1 in the state in which the electrode back surfaces 20B of the composite integrated film 1 and the pad front surfaces 80A of the circuit board 70 are physically and electrically connected to each other by the bonding by the intermolecular forces, and the composite integrated film 1 at the abnormal position can be changed with ease. Accordingly, the LED display type display unit 61 is capable of remarkably increasing the manufacturing yield while increasing the packaging density.

2. Second Embodiment

Figure 12A:
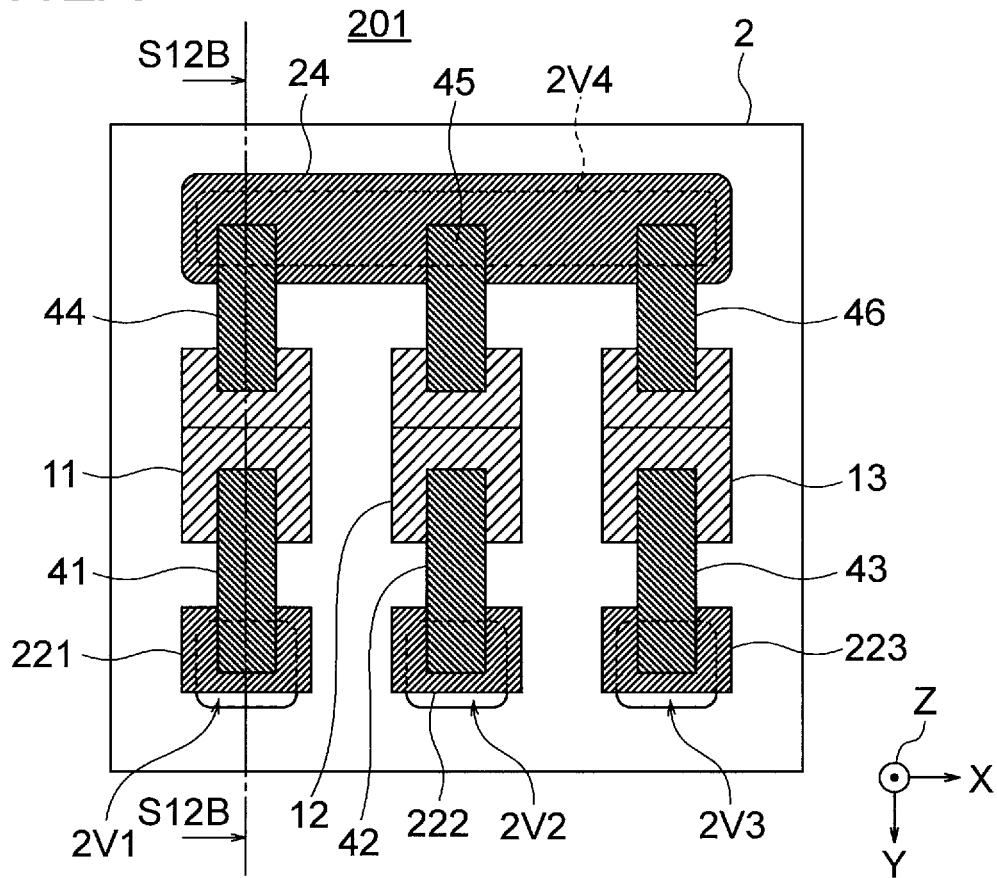
FIGS. 12A and 12B are a schematic plan view and a schematic cross-sectional view showing the configuration of a composite integrated film according to a second embodiment.
Figure 12B:
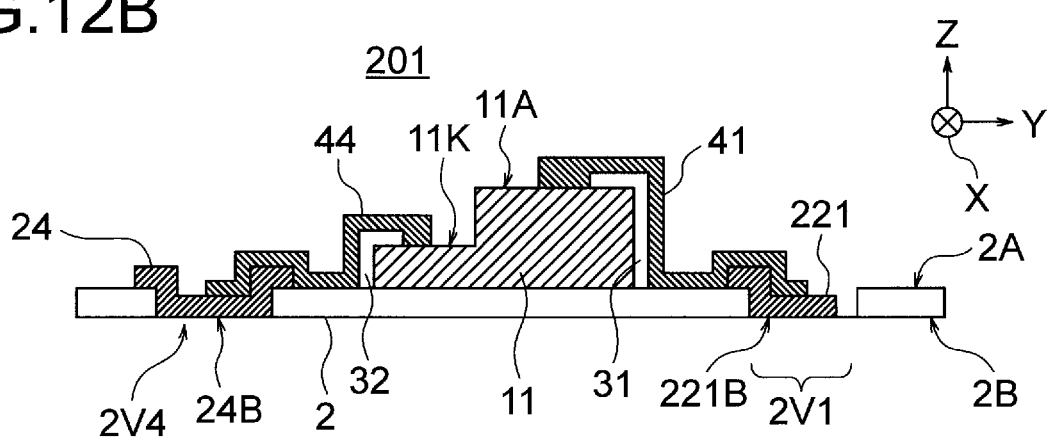

FIGS. 12A and 12B are a schematic plan view and a schematic cross-sectional view showing the configuration of a composite integrated film 201 according to a second embodiment. In the above-described first embodiment, the description of the composite integrated film 1 was given of the case where each connection electrode 20 (e.g., the connection electrode 21) is formed in a shape filling in the whole region of the base member through hole 2V (e.g., the base member through hole 2V1) formed in the base member thin film 2 (FIGS. 1A to 1C). However, as shown in FIGS. 12A and 12B respectively corresponding to FIGS. 1A and 1B, for example, it is also possible in the composite integrated film 201 to form each connection electrode 221, 222, 223 in a shape filling in only a part of the base member through hole 2V1, 2V2, 2V3. The point is that it is permissible if a part of the connection electrode 20 (e.g., the connection electrode 21) or the wiring member 40 (e.g., the anode wiring member 41) steps over to the base member thin film 2 and the light-emitting element 10 (e.g., the red light-emitting element 11) from the inside of the base member through hole 2V (e.g., the base member through hole 2V1) and thereby forms electrical connection from the electrode back surface 20B (e.g., the electrode back surface 21B) to the terminal surface (e.g., the anode terminal surface 11A). On top of this condition, when the composite integrated film 201 has been stuck on the circuit board 70, it is desirable if each electrode back surface 20B (e.g., the electrode back surface 21B) as the surface of the connection electrode 20 (e.g., the connection electrode 21) on the −Z direction side is flat, the electrode back surface 20B (e.g., the electrode back surface 21B) and the base member back surface 2B form substantially the same plane (namely, a single flat surface or a common flat surface) as, and the flat surface has a sufficient area. With this configuration, each connection electrode 20 (e.g., the connection electrode 21) can be joined to the connection pad 80 (e.g., the column wiring connection pad 81) of the circuit board 70 (e.g., FIG. 7) with sufficiently strong intermolecular forces and the electrically connected state can be maintained between the connection electrode 20 and the connection pad 80. The same applies to the connection electrode 24.

3. Third Embodiment

Figure 13:
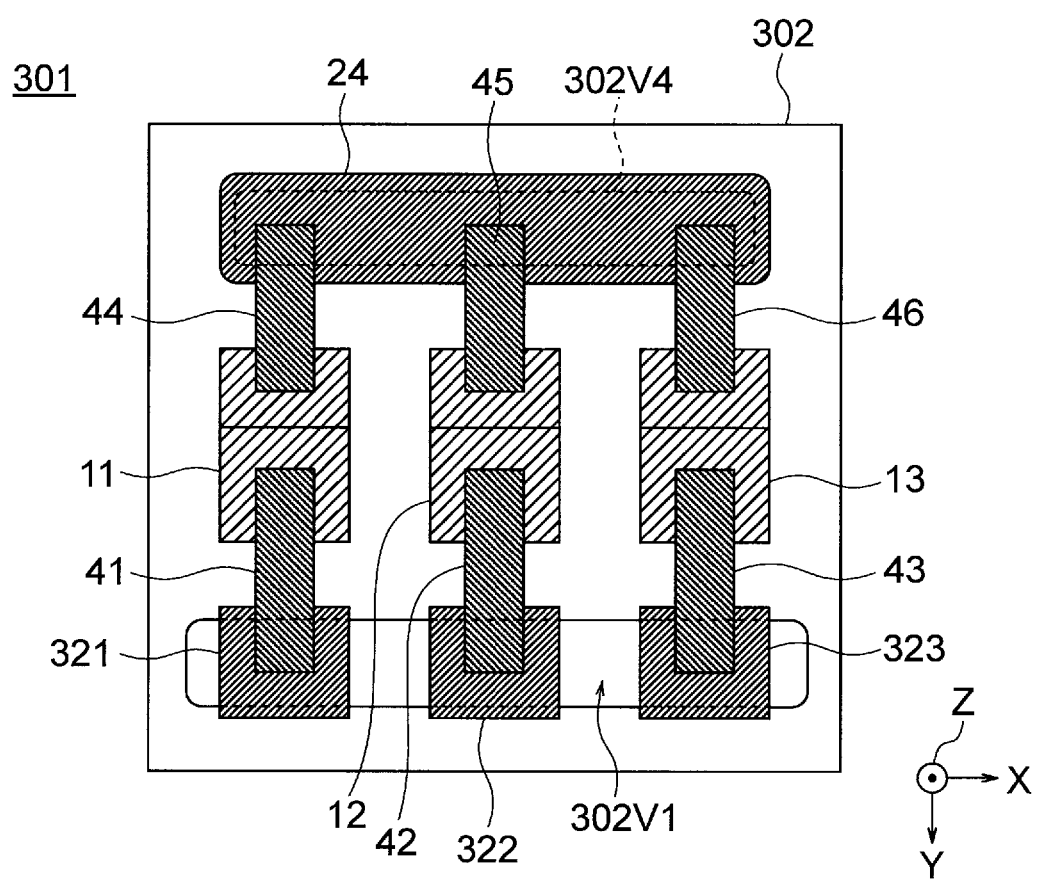
FIG. 13 is a schematic plan view showing the configuration of a composite integrated film according to a third embodiment.

FIG. 13 is a schematic plan view showing the configuration of a composite integrated film 301 according to a third embodiment. In the above-described first and second embodiments, the description was given of the case where the base member through holes 2V1, 2V2 and 2V3 are formed in the base member thin film 2 as through holes independent of each other in the composite integrated film 1, 201 (FIGS. 1A to 1C, FIGS. 12A and 12B). However, as in the composite integrated film 301 shown in FIG. 13, for example, it is also possible to provide one through hole 302V1 that is long in the X direction in a base member thin film 302 and provide connection electrodes 321, 322 and 323 that fill in parts of the through hole 302V1 to be separate from each other in the X direction. In this case, it is permissible if surfaces of the connection electrodes 321, 322 and 323 on the −Z direction side are flat, have sufficient areas, and are electrically isolated from each other.

4. Fourth Embodiment

Figure 14A:
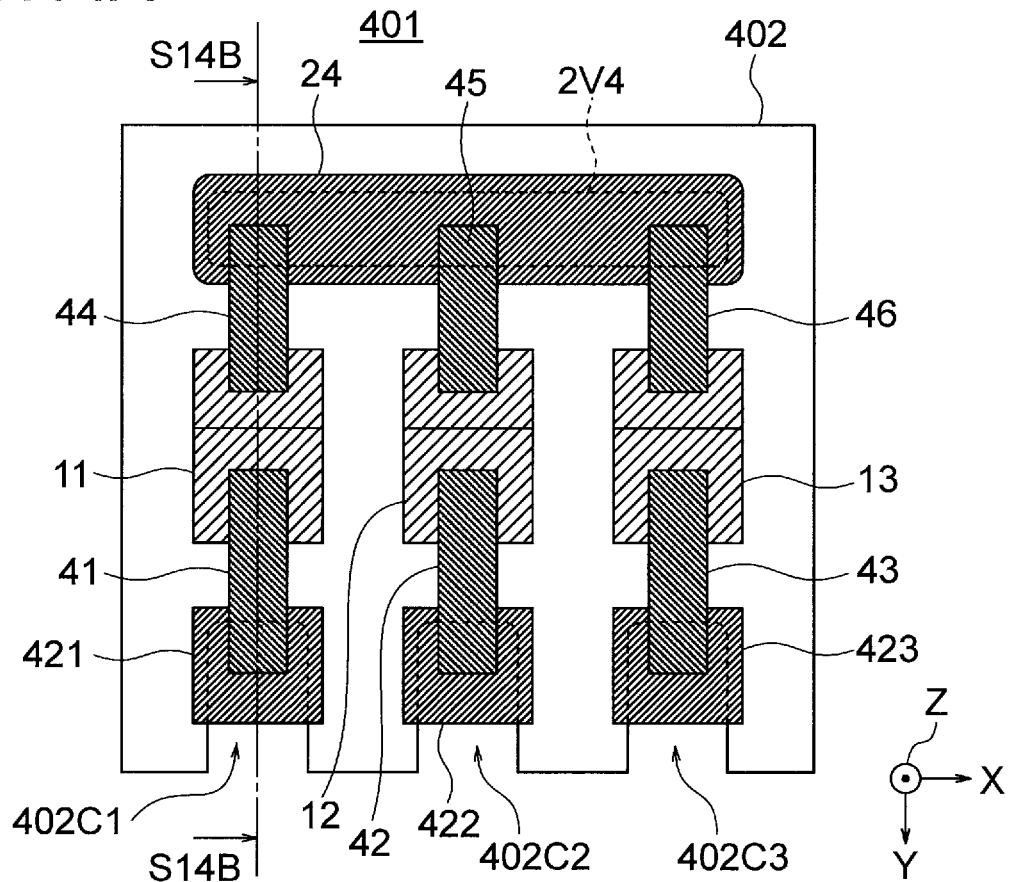
FIGS. 14A and 14B are a schematic plan view and a schematic cross-sectional view showing the configuration of a composite integrated film according to a fourth embodiment.
Figure 14B:
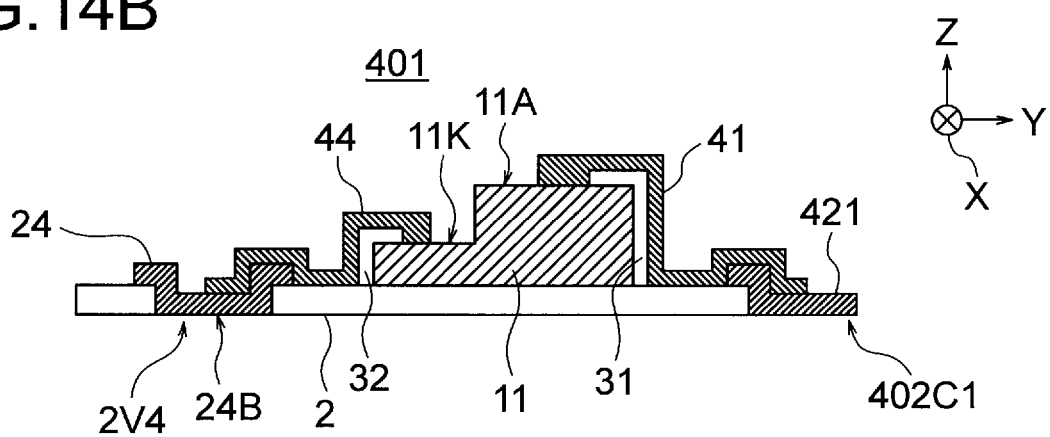

FIGS. 14A and 14B are a schematic plan view and a schematic cross-sectional view showing the configuration of a composite integrated film 401 according to a fourth embodiment. FIG. 14B shows a cross section taken along the line S14B-S14B in FIG. 14A. In the above-described first to third embodiments, the description of the composite integrated films 1, 201 and 301 was given of the case where the base member through holes 2V1, 2V2 and 2V3 whose peripheries are surrounded are formed inside the base member thin film 2 and the connection electrodes 21, 22 and 23 that fill in the base member through holes 2V1, 2V2 and 2V3 are provided (FIGS. 1A to 1C, FIGS. 12A and 12B, FIG. 13). However, as in the composite integrated film 401 shown in FIGS. 14A and 14B corresponding to FIGS. 1A and 1B, for example, it is also possible to provide a base member thin film 402 with notch parts 402C1, 402C2 and 402C3 as voids extending inward from the outer periphery instead of the base member through holes 2V1, 2V2 and 2V3. In this case, it is possible to provide connection electrodes 421, 422 and 423 respectively in shapes filling in only parts of the notch parts 402C1, 402C2 and 402C3. The same applies to the connection electrode 24.

5. Fifth Embodiment

Figure 15:
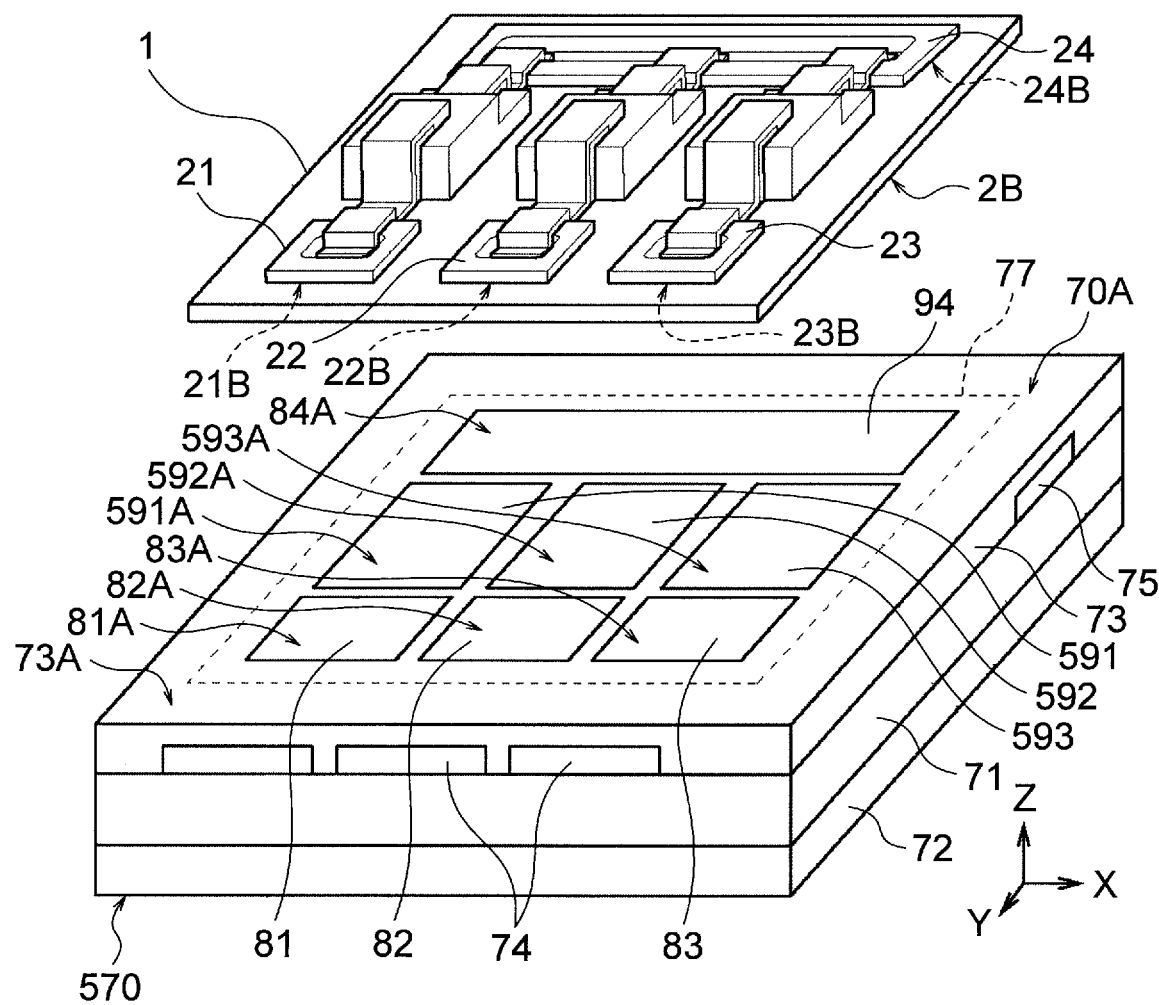
FIG. 15 is a schematic perspective view showing a process of sticking the composite integrated film in a fifth embodiment.
Figure 16:
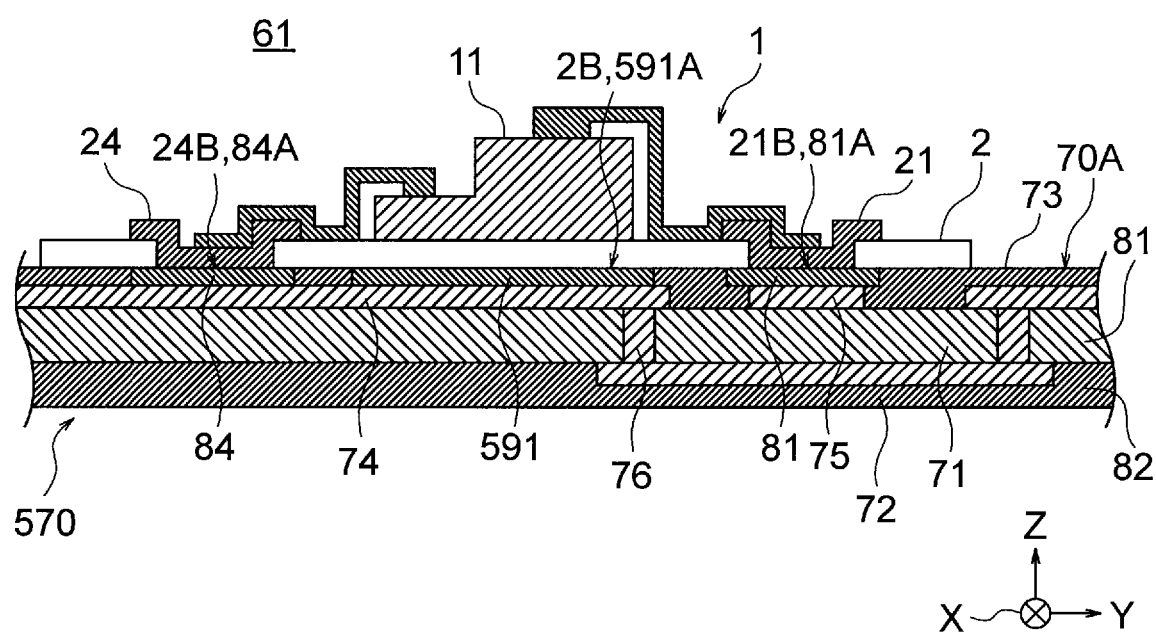
FIG. 16 is a schematic cross-sectional view showing the process of sticking the composite integrated film on the circuit board shown in FIG. 15.

FIG. 15 is a schematic perspective view showing a process of sticking the composite integrated film 1 (or 201, 301 or 401) on a circuit board 570. FIG. 16 is a schematic cross-sectional view showing the process of sticking the composite integrated film 1 on the circuit board 570 shown in FIG. 15. In the above-described first to fourth embodiments, the description was given of the case where the substrate front surface 70A of the circuit board 70 is provided with the connection pads 80 (the column wiring connection pads 81, 82 and 83 and the row common wiring connection pads 84) at positions corresponding to the connection electrodes 20 of the composite integrated films 1. However, as in the circuit board 570 shown in FIG. 15 and FIG. 16 corresponding to FIG. 7 and FIG. 8, for example, it is also possible to provide sub-connection pads 591, 592 and 593 made of an electrically conductive material at positions facing the base member back surface 2B of the composite integrated film 1, in addition to the connection pads 80. These sub-connection pads 591, 592 and 593 make their pad front surfaces 591A, 592A and 593A join to the base member back surface 2B (i.e., parts other than the electrode back surfaces 20B) of the composite integrated film 1 by the intermolecular forces, and thus can contribute to the maintenance of the state with the composite integrated film 1 stuck on the circuit board 70. Further, since the sub-connection pads 591, 592 and 593 are properly connected to the column wiring members 74 and so forth inside the circuit board 570, heat generated in the composite integrated film 1 can be efficiently transmitted to the inside of the circuit board 570, that is, the sub-connection pads 591, 592 and 593 can function as heat radiation members. Furthermore, since the sub-connection pads 591, 592 and 593 are properly connected to the column wiring members 74 and so forth, the sub-connection pads 591, 592 and 593 can also be used for measurement, test or the like of an electrical characteristic, by placing probes, connected to a prescribed test jig, in contact with the sub-connection pads in a test or the like of the circuit board 70, for example.

6. Other Embodiments

In the above-described first to fifth embodiments, the description was given of the case where the base member thin film 2 is formed in a rectangular shape as viewed in the Z direction. However, the base member thin film 2 may also be formed in a different shape such as a triangular shape, a hexagonal shape, an octagonal shape or a circular shape. For example, the shape may be determined depending on the purpose, such as a shape with which the manufacture on the formation substrate 51 can be performed efficiently at the time of manufacturing the composite integrated film 1 or a shape with which the plurality of composite integrated films 1 can be arranged efficiently on the circuit board 70.

In the above-described embodiments, the description was given of the case where one composite integrated film 1 is made to correspond to one pixel (picture element) by providing one base member thin film 2 with one red light-emitting element 11, one green light-emitting element 12 and one blue light-emitting element 13. However, it is also possible to make one composite integrated film correspond to a plurality of pixels, such as making one composite integrated film correspond to two pixels by providing a base member thin film having a size and a shape corresponding to two base member thin films 2 with two red light-emitting elements 11, two green light-emitting elements 12 and two blue light-emitting elements 13, for example.

In the above-described embodiments, the description of the composite integrated film 1 was given of the case where three types of light-emitting elements (the red light-emitting element 11, the green light-emitting element 12 and the blue light-emitting element 13) respectively emitting light of three colors (red, green and blue) different from each other are provided on the base member front surface 2A of the base member thin film 2 (FIGS. 1A to 1C). However, it is also possible to provide two or less types or four or more types of light-emitting elements respectively emitting light of colors different from each other or the same color. Further, it is possible to provide an electronic element having a variety of function such as a light receiving element, and it is also possible to provide a plurality of types of elements in combination and form a variety of device using the combination of the plurality of types of elements. For example, an image sensor device may be formed instead of the LED display device 60 by providing p-n junction photodiodes on the base member front surface 2A. It is also possible, for example, to form a contact area sensor device (so-called touch panel) instead of the LED display device 60 by providing capacitance devices or the like on the base member front surface 2A. In these cases, the number of connection electrodes connected to each element is not limited to two but can also be three or more.

In the above-described embodiments, the description was given of the case where the anode wiring member 41 is directly connected to the anode terminal surface 11A and the connection electrode 21 and the cathode wiring member 44 is directly connected to the cathode terminal surface 11K and the connection electrode 24 in regard to the red light-emitting element 11, for example (FIGS. 1A to 1C). However, it is also possible, for example, to provide a contact electrode between the anode terminal surface 11A and the anode wiring member 41 and between the cathode terminal surface 11K and the cathode wiring member 44. With this configuration, each part where a semiconductor and a metal are connected together forms the so-called Schottky connection and the occurrence of nonlinear resistance can be avoided. The same applies to the green light-emitting element 12 and the blue light-emitting element 13.

In the above-described embodiments, the description was given of the case where the light-emitting elements 10, the connection electrodes 20, the interlayer insulation films 31 and 32 and the wiring members 40 are provided on the base member thin film 2 in the composite integrated film 1 (FIG. 1). However, it is also possible, for example, to provide the composite integrated film with a variety of component or material such as a surface protection film, a reflector or a heat radiation material, or a combination of some of them.

In the above-described embodiments, the description was given of the case where the formation substrate 51 having the extremely flat formation surface 52 is used in the manufacturing process of the composite integrated film 1 (FIG. 3A). However, it is also possible, for example, to use a formation substrate having a planarizing layer or a formation substrate after undergoing processing such as polishing.

In the above-described embodiments, the description was given of the case where the light-emitting elements 10 manufactured by prescribed LED manufacturing equipment or the like are transferred onto the base member front surface 2A of the base member thin film 2 in the manufacturing process of the composite integrated film 1 (FIG. 2, step SP4). However, it is also possible, for example, to form the light-emitting elements 10 by executing various manufacturing processes like those for various semiconductors on the base member front surface 2A.

In the above-described embodiments, the description was given of the case where the connection electrodes 20 and the wiring members 40 are provided successively by processes independent of each other in the manufacturing process of the composite integrated film 1 (FIGS. 3A to 3F). However, it is also possible, for example, to form the connection electrodes 20 and the wiring members 40 at the same time with the same material and integrate together parts to be electrically connected to each other such as the connection electrode 21 and the anode wiring member 41, for example.

In the above-described embodiments, the description was given of the case where the step SP4 for transferring the light-emitting elements 10 is executed after the step SP3 for forming the connection electrodes 20 in the manufacturing process of the composite integrated film 1. However, it is also possible, for example, to form the connection electrodes 20 after transferring the light-emitting elements 10. Further, in this case, it is also possible to form the connection electrodes 20 and the wiring members 40 in a lump as mentioned above.

In the above-described embodiments, the description was given of the case where one composite integrated film 1 is picked up from the formation substrate 51 and stuck on the circuit board 70 by the transfer stamp 101 in the manufacturing process of the LED display type display unit 61 (FIG. 10, steps SP21 and SP22 and FIGS. 11A and 11B). However, the embodiments are not limited to this case and it is also possible, for example, to pick up a plurality of composite integrated films 1 from the formation substrate 51 and stick the plurality of composite integrated films 1 on the circuit board 70 by using a transfer stamp capable of picking up a plurality of composite integrated films 1 in a lump.

In the above-described embodiments, the description was given of the case where pressure is applied when sticking the composite integrated film 1 on the circuit board 70 by using the transfer stamp 101 in the manufacturing process of the LED display type display unit 61 (FIG. 10, step SP22). However, it is also possible, for example, to apply a certain level of heat together with pressure.

In the above-described embodiments, the description was given of the case where the composite integrated film 1 is peeled off from the circuit board 70 after weakening the bonding by the intermolecular forces by discharging a prescribed solvent from the peeling head 105 towards the abnormal position in the case where the abnormal position is detected in the manufacturing process of the LED display type display unit 61 (FIG. 10, step SP27). However, it is also possible, for example, to peel off the composite integrated film 1 from the circuit board 70 after weakening the bonding by the intermolecular forces by a different method, or without weakening the bonding by the intermolecular forces.

In the above-described embodiments, the description was given of the case where the LED display type display unit 61 is considered to have been completed in the state in which the connection electrodes 20 of the composite integrated films 1 and the connection pads 80 of the circuit board 70 are bonded to each other just by the intermolecular forces in the case where no abnormal position is detected in the manufacturing process of the LED display type display unit 61 (FIG. 10, step SP26). However, it is also possible, for example, to further increase the joint strength between the connection electrodes 20 and the connection pads 80 by forming eutectic bonds (i.e., eutectic joints) between the connection electrodes 20 and the connection pads 80 by applying at least one of high pressure and heat in the case where no abnormal position is detected (the case of the negative result in the step SP26). In this case, in the LED display type display unit 61, the state in which the connection electrodes 20 and the connection pads 80 are bonded to each other just by the intermolecular forces can be regarded as a state of "provisional fixation" in which the connection electrodes 20 and the connection pads 80 are electrically connected to each other and fixed to each other by relatively weak force allowing for easy replacement, and the state in which the eutectic bonds have been formed can be regarded as a state of "full fixation" in which the connection electrodes 20 and the connection pads 80 are firmly fixed to each other by relatively strong force at a level of preventing easy peeling.

In the above-described embodiments, the description was given of the case where the circuit board 70 is formed in a planar shape and the LED display device 60 is formed as a so-called flat panel display by forming the base member part 71 of the circuit board 70 with glass epoxy resin. However, it is also possible, for example, to form an LED display device as a flexible display capable of curving and bending by using a flexible substrate having flexibility instead of the circuit board 70.

It is also possible to arbitrarily combine two or more of the above-described embodiments.

In the above-described embodiments, the description was given of the case where the composite integrated film 1 as a composite integrated film is formed with the base member thin film 2 as a base member thin film, the base member through holes 2V as penetration parts, the connection electrodes 20 as electrodes and the light-emitting elements 10 as elements. However, it is also possible to form the composite integrated film with a base member thin film made in a variety of different configuration, penetration parts, electrodes and elements.

The embodiments can be used for an LED display formed by arranging a plurality of LEDs, for example.

DESCRIPTION OF REFERENCE CHARACTERS 1, 201, 301, 401: composite integrated film, 1B: film back surface, 2: base member thin film, 2A: base member front surface (base member first surface), 2B: base member back surface (base member second surface), 2V, 2V1, 2V2, 2V3, 2V4: base member through hole (penetration part), 10: light-emitting elements, 11: red light-emitting element, 12: green light-emitting element, 13: blue light-emitting element, 11A, 12A, 13A: anode terminal surface, 11K, 12K, 13K: cathode terminal surface, 20, 21, 22, 23, 24: connection electrode (electrode), 20B, 21B, 22B, 23B, 24B: electrode back surface (electrode surface), 40: wiring members, 41, 42, 43: anode wiring member, 44, 45, 46: cathode wiring member, 50: manufacturing equipment, 51: formation substrate (wafer), 52: formation surface, 53: thin film layer, 60: LED display device (semiconductor composite device), 61: LED display type display unit, 66: display driver (drive circuit), 70: circuit board, 70A: substrate front surface (front surface), 71: base member part, 72, 73: insulation layer, 73A: insulation front surface, 74: column wiring member (first direction wire), 75: row common wiring member (second direction wire), 76: internal wiring member, 77: sticking region, 80: connection pad, 80A, 81A, 82A, 83A, 84A, 591A, 592A, 593A: pad front surface, 81, 82, 83: column wiring connection pad, 84: row common wiring connection pad, 90: circuit board manufacturing equipment, 402C1, 402C2, 402C3: notch part (penetration part), 591, 592, 593: sub-connection pad.

What is claimed is:
1. A composite integrated film comprising:
    a base member thin film having a base member first surface and a base member second surface facing each other, the base member thin film having a thickness less than or equal to 20 [μm] and being formed of an insulating material;

one or more penetration parts penetrating the base member first surface and the base member second surface of the base member thin film;

one or more electrodes each including an electrical path part formed between the base member first surface and the base member second surface via the penetration part and an electrode surface in a planar shape formed on the base member second surface's side, the one or more electrodes being each provided to step over to the base member first surface's side;

one or more elements provided on the base member first surface of the base member thin film and electrically connected to the electrodes; and one or more wiring members provided on the base member first surface of the base member thin film, and directly connecting the one or more electrodes and the one or more elements, respectively, wherein the electrode surface and the base member second surface form a same flat surface.

2. The composite integrated film according to claim 1, wherein surface roughness of the base member second surface and the electrode surface is less than or equal to 10 [nm].

3. The composite integrated film according to claim 1, wherein
the base member thin film is of a rectangular shape having a first side length and a second side length longer than the first side length, and
a film level difference as a distance between the base member second surface and the electrode surface in regard to a normal direction of the base member second surface is less than or equal to 1/1000 of the first side length.

4. The composite integrated film according to claim 1, wherein the penetration part is a through hole that penetrates the base member first surface and the base member second surface inside the base member thin film or a notch part as a void extending inward from an outer periphery of the base member thin film.

5. The composite integrated film according to claim 1, wherein the one or more elements include a plurality of light-emitting elements each formed with two or more types of materials different from each other.

6. A composite integrated film supply wafer comprising:
a wafer; and
a plurality of the composite integrated films according to claim 1,
wherein at least either of the base member second surface or the electrode surface on each of the plurality of composite integrated films and a front surface of the wafer are in contact with each other.

7. The composite integrated film supply wafer according to claim 6, wherein surface roughness of the front surface of the wafer is less than or equal to 10 [nm].

8. A semiconductor composite device comprising:
a circuit board; and
a plurality of the composite integrated films according to claim 1, wherein
the circuit board includes:
    a drive circuit that selectively drives a plurality of the elements;
    a plurality of first direction wires;
    a plurality of second direction wires; and
    a plurality of connection pads each being electrically connected to the first direction wire or the second direction wire,
the electrode surfaces of the composite integrated films are joined to the connection pads of the circuit board by intermolecular forces, and
at least a part of the base member second surface of the composite integrated film is joined to a front surface of the circuit board by intermolecular forces.

9. A semiconductor composite device comprising:
a circuit board; and
a plurality of the composite integrated films according to claim 1, wherein
the circuit board includes:
    a drive circuit that selectively drives a plurality of the elements;
    a plurality of first direction wires;
    a plurality of second direction wires; and
    a plurality of connection pads each being electrically connected to the first direction wire or the second direction wire,
the electrode surfaces of the composite integrated films are joined to the connection pads of the circuit board by eutectic joining, and
at least a part of the base member second surface of the composite integrated film is joined to a front surface of the circuit board by intermolecular forces.

10. The semiconductor composite device according to claim 8, wherein surface roughness of a front surface of the connection pad of the circuit board is less than or equal to 10 [nm].

11. The semiconductor composite device according to claim 8, wherein at least a part of the base member second surface of the composite integrated film is joined to a part of the circuit board other than the connection pads by intermolecular forces.

12. A semiconductor composite device,
a circuit board; and
a plurality of composite integrated films,
wherein each of the plurality of composite integrated films includes:
    a base member thin film having a base member first surface and a base member second surface facing each other;
    one or more penetration parts penetrating the base member first surface and the base member second surface of the base member thin film;
    one or more electrodes each including an electrical path part formed between the base member first surface and the base member second surface via the penetration part and an electrode surface in a planar shape formed on the base member second surface's side; and
    one or more elements provided on the base member first surface of the base member thin film and electrically connected to the electrodes,
    wherein the electrode surface and the base member second surface form a same flat surface;
wherein the circuit board includes:
    a drive circuit that selectively drives a plurality of the elements,
    a plurality of first direction wires,
    a plurality of second direction wires, and
    a plurality of connection pads each being electrically connected to the first direction wire or the second direction wire;

wherein the electrode surfaces of the composite integrated films are joined to the connection pads of the circuit board by intermolecular forces;

wherein at least a part of the base member second surface of the composite integrated film is joined to a front surface of the circuit board by intermolecular forces; and wherein the circuit board includes sub-connection pads that are joined to the base member second surfaces by intermolecular forces without being joined to the electrode surfaces of the composite integrated films.

13. The semiconductor composite device according to claim 8, wherein the circuit board has an insulation layer that covers the front surface other than the connection pads, a front surface of the insulation layer and front surfaces of the connection pads form a same flat surface, and at least a part of the base member second surface of the composite integrated film is joined to the front surface of the insulation layer by intermolecular forces.

14. The semiconductor composite device according to claim 13, wherein a substrate level difference as a distance between the front surface of the insulation layer and the front surface of the connection pad in regard to a normal direction of the front surface of the insulation layer is less than or equal to 1/1000 of a shortest side in an external form of the base member thin film in the composite integrated film.

15. The composite integrated film according to claim 1, wherein the one or more electrodes each close and cover the penetration part and a vicinity of the penetration part from the base member first surface's side.

16. A method of manufacturing a semiconductor composite device, the method comprising:

picking up a composite integrated film from a formation substrate having a flat formation surface, wherein the composite integrated film is formed on the formation substrate in advance, and includes a base member thin film having a base member first surface and a base member second surface facing each other, one or more penetration parts penetrating the base member first surface and the base member second surface of the base member thin film, one or more electrodes each including an electrical path part formed between the base member first surface and the base member second surface via the penetration part and an electrode surface in a planar shape formed on the base member second surface's side, and one or more elements provided on the base member first surface of the base member thin film and electrically connected to the electrodes; and sticking the composite integrated film on a flat board surface of a circuit board so that the base member second surface of the base member thin film is bonded to the board surface of the circuit board.

17. The method of manufacturing a semiconductor composite device according to claim 16, wherein surface roughness of the formation surface, the base member second surface, the electrode surface and the board surface is less than or equal to 10 [nm].

18. The method of manufacturing a semiconductor composite device according to claim 16, wherein the one or more electrodes are provided so as to step over to the base member first surface.

19. The method of manufacturing a semiconductor composite device according to claim 18, wherein the one or more electrodes each close and cover the penetration part and a vicinity of the penetration part from the base member first surface's side.

* * * * *